(12) United States Patent
Banno

(10) Patent No.: US 12,510,813 B2
(45) Date of Patent: Dec. 30, 2025

(54) LIGHT SOURCE DEVICE AND DISPLAY APPARATUS

(71) Applicant: Mayu Banno, Kanagawa (JP)

(72) Inventor: Mayu Banno, Kanagawa (JP)

(73) Assignee: Ricoh Company, Ltd., Tokyo (JP)

(*) Notice: Subject to any disclaimer, the term of this patent is extended or adjusted under 35 U.S.C. 154(b) by 309 days.

(21) Appl. No.: 18/341,857

(22) Filed: Jun. 27, 2023

(65) Prior Publication Data

US 2024/0004276 A1 Jan. 4, 2024

(30) Foreign Application Priority Data

Jul. 1, 2022 (JP) .................................. 2022-107391
Apr. 25, 2023 (JP) .................................. 2023-071793

(51) Int. Cl.
*G03B 21/16* (2006.01)
*G03B 21/20* (2006.01)
*H05K 7/20* (2006.01)

(52) U.S. Cl.
CPC ......... *G03B 21/16* (2013.01); *G03B 21/2013* (2013.01); *H05K 7/20409* (2013.01)

(58) Field of Classification Search
None
See application file for complete search history.

(56) References Cited

FOREIGN PATENT DOCUMENTS

JP 2017-195057 10/2017
JP 2022080202 A * 5/2022

* cited by examiner

*Primary Examiner* — Bao-Luan Q Le
*Assistant Examiner* — Danell L Owens
(74) *Attorney, Agent, or Firm* — Harness, Dickey & Pierce, P.L.C.

(57) ABSTRACT

A light source device includes: four or more of heat generators; a container accommodating the four or more of heat generators; multiple heat dissipation members outside the container; and an exterior case accommodating the container and the multiple heat dissipation members. The container has: a first container surface; a second container surface; and a third container surface. The four or more of heat generators include: a first heat generator; a second heat generator; a third heat generator; a fourth heat generator. The multiple heat dissipation members include: a first heat dissipation member; a second heat dissipation member; and a third heat dissipation member. The exterior case includes a first exterior surface, the second heat dissipation member, and the third heat dissipation member. The first exterior surface of the exterior case exhausts air from the first heat dissipation member, the second heat dissipation member, and the third heat dissipation member.

19 Claims, 13 Drawing Sheets

LIGHT SOURCE DEVICE AND DISPLAY APPARATUS

CROSS-REFERENCE TO RELATED APPLICATIONS

This patent application is based on and claims priority pursuant to 35 U.S.C. § 119(a) to Japanese Patent Application No. 2022-107391, filed on Jul. 1, 2022, in the Japan Patent Office, and Japanese Patent Application No. 2023-071793, filed on Apr. 25, 2023, in the Japan Patent Office, the entire disclosure of which are hereby incorporated by reference herein.

BACKGROUND

Technical Field

The present disclosure relates to a light source device and a display apparatus.

Related Art

A display apparatus to project an image by using a laser light source and the phosphor is known. For example, in order to emit a fluorescent light beam having higher illuminance, a technique including a laser light source to emit a laser light beam, at least two phosphor substrates having phosphors excited by the laser light beam to emit a florescent light beam, an optical element to combine at least two fluorescent light beams emitted from each of the two phosphor substrates is disclosed.

SUMMARY

A light source device includes: four or more of heat generators; a container accommodating the four or more of heat generators, the container having: a first container surface; a second container surface perpendicular to the first container surface; and a third container surface perpendicular to the first container surface and opposed to the second container surface; multiple heat dissipation members outside the container, the multiple heat dissipation members to cool to the four or more of the heat generators; and an exterior case accommodating the container and the multiple heat dissipation members. The four or more of heat generators include: a first heat generator on the first container surface; a second heat generator on the first container surface; a third heat generator on the second container surface; a fourth heat generator on the third container surface. The multiple heat dissipation members include: a first heat dissipation member thermally connected to the first container surface; a second heat dissipation member thermally connected to the second container surface; and a third heat dissipation member thermally connected to the third container surface. The exterior case includes a first exterior surface opposed to the first heat dissipation member, the second heat dissipation member, and the third heat dissipation member. The first exterior surface of the exterior case exhausts air from the first heat dissipation member, the second heat dissipation member, and the third heat dissipation member.

Further, an embodiment of the present disclosure provides a display apparatus including: the light source device to emit a light beam; a light homogenizer to homogenize the light beam emitted from the light source device and emit a homogenized light beam; an image generation element to generate an image by modulating the homogenized light beam emitted from the light homogenizer; and a projection optical system to magnify and project the image onto a projection surface.

BRIEF DESCRIPTION OF THE DRAWINGS

A more complete appreciation of the disclosure and many of the attendant advantages and features thereof can be readily obtained and understood from the following detailed description with reference to the accompanying drawings, wherein.

Figure 1:
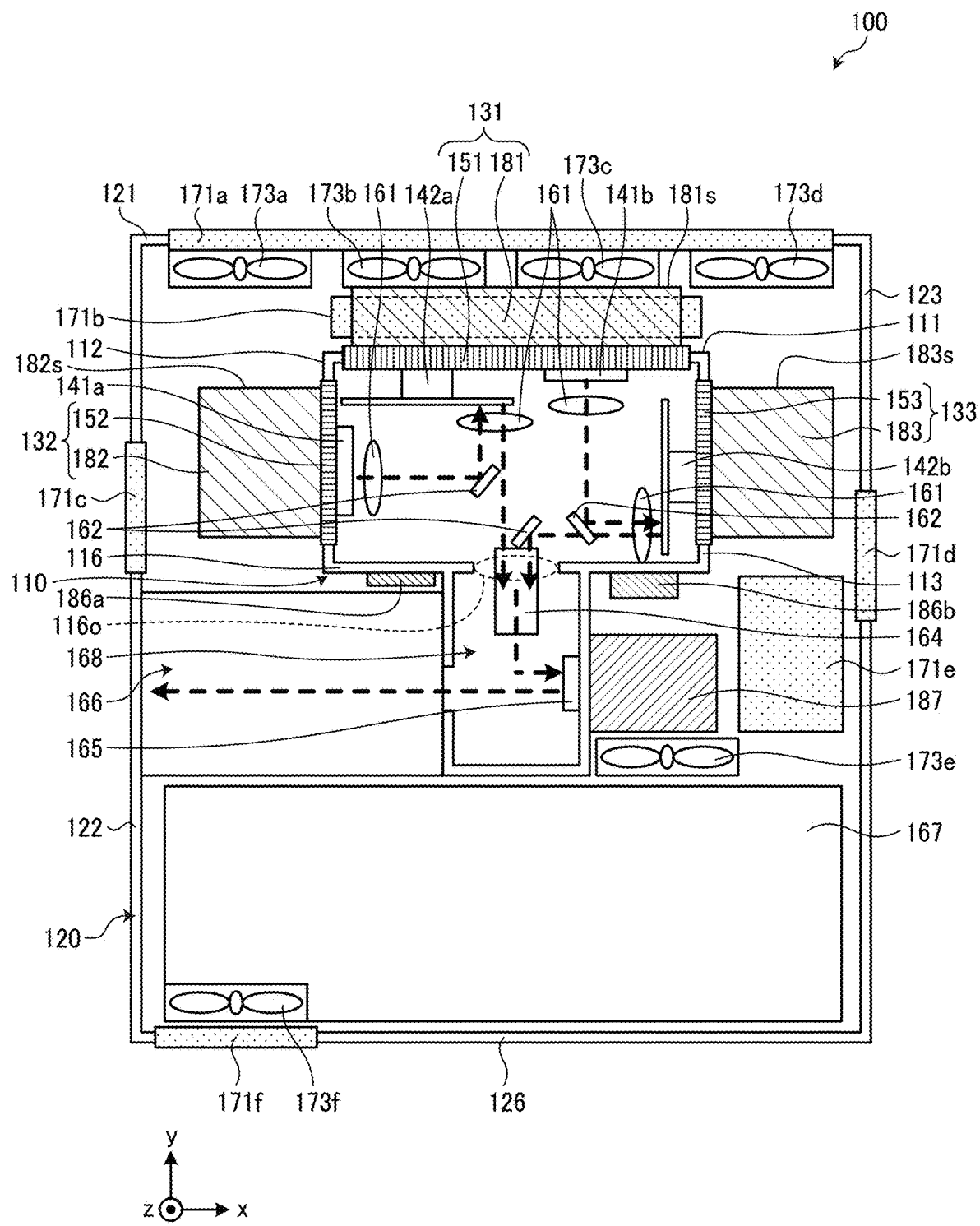
FIG. 1 is a diagram of an inner configuration of the light source device according to a first embodiment as an example.

The accompanying drawings are intended to depict embodiments of the present invention and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

Referring now to the drawings, embodiments of the present disclosure are described below. As used herein, the singular forms "a," "an," and "the" are intended to include the plural forms as well, unless the context clearly indicates otherwise.

According to the disclosure of the present invention, a heat generator can be efficiently cooled.

Herein, embodiments of a light source device and a display apparatus will be described in detail with reference to the accompanying drawings.

First Embodiment

Figure 2:
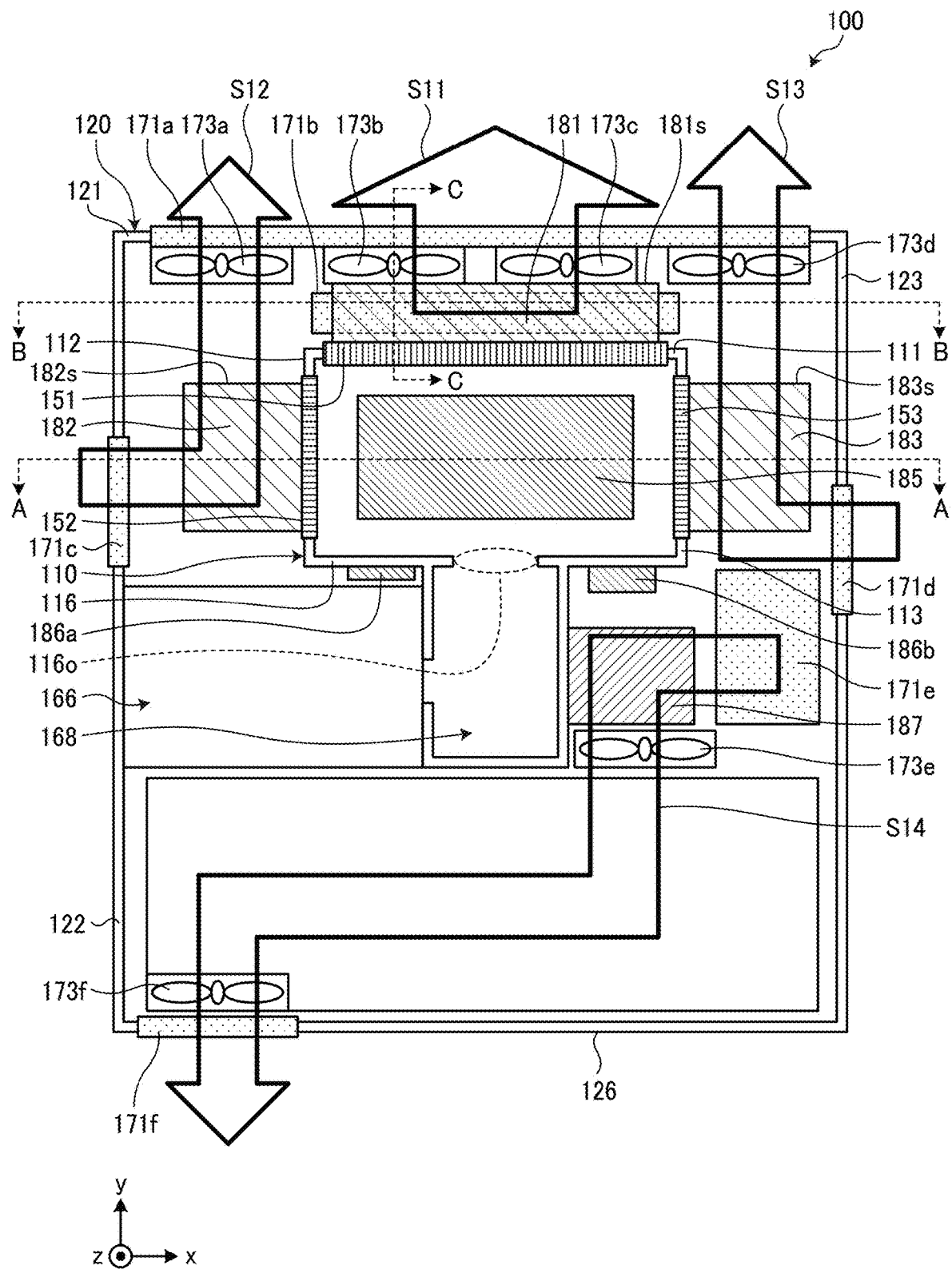
FIG. 2 is a diagram of an air flow path of the light source device according to the first embodiment as an example.

FIG. 1 is a diagram of an inner configuration of the light source device according to a first embodiment as an example. FIG. 2 is a diagram of an air flow path of the light source device according to the first embodiment as an example. FIG. 1 is a cross-sectional view parallel to the XY-plane of the light source device 100, and FIG. 2 is a diagram of the light source device 100 removing the fifth surface (fifth exterior surface 125) of the exterior case 120 described below.

As illustrated in FIG. 1 and FIG. 2, the light source device 100 includes: two light emitters (i.e., a light emitter 141a and a light emitter 141b) that are light-emission-and-heat-generation members, two light reception members (i.e., a light reception member 142a and a light reception member 142b) that are light-reception-and-heat-generation members, a container 110, three heat dissipation members (i.e., a heat dissipation members 181, a heat dissipation members 182, and a heat dissipation members 183), multiple auxiliary heat dissipation members (i.e., the auxiliary heat dissipation member 185, the auxiliary heat dissipation member 185, the auxiliary heat dissipation member 186a, the auxiliary heat dissipation member 186, and the auxiliary heat dissipation member 187), and multiple intake and exhaust ports (i.e., the intake and exhaust port 171a, the intake and exhaust port 171b, the intake and exhaust port 171c, the intake and exhaust port 171d, the intake and exhaust port 171e, and the intake and exhaust port 171f), and the exterior case 120. Hereinafter, when the light emitter 141a (the first light emitter) and the light emitter 141b (the second light emitter) are not distinguished to describe, the light emitter 141a (the first light emitter) and the light emitter 141b (the second light emitter) may be referred to as a light emitter 141, and the light reception member 142a and the light reception member 142 are not distinguished to describe, the light reception member 142a and the light reception member 142b may be referred to as a light reception member 142. The light emitter 141a, the light emitter 141b, the light reception member 142a, and the light reception member 142b are also heat generators. Hereinafter, when the heat dissipation member 181 (the first heat dissipation member), the heat dissipation member 182 (the second heat dissipation member), the heat dissipation member 183 (the third heat dissipation member), the auxiliary heat dissipation member 185, the auxiliary heat dissipation member 186a, the auxiliary heat dissipation member 186b, the auxiliary heat dissipation member 186, and the auxiliary heat dissipation member 187 are not distinguished to describe, the heat dissipation member 181 (the first heat dissipation member), the heat dissipation member 182 (the second heat dissipation member), the heat dissipation member 183 (the third heat dissipation member), the auxiliary heat dissipation member 185, the auxiliary heat dissipation member 186a, the auxiliary heat dissipation member 186b, the auxiliary heat dissipation member 187 may be referred to as a heat dissipation member 180.

The container 110 is installed in the exterior case 120 and accommodates the light emitter 141, the light reception member 142, and optical members 160 such as an optical lens 161 or a minor 162. In the drawings, some optical members may be omitted or shapes of the optical members may be simplified for the sake of convenience.

The container 110 has a rectangular parallelepiped shape (i.e., a hexahedron) having a first container surface 111, a second container surface 112, a third container surface 113, a fourth container surface 114, a fifth container surface 115, and a sixth container surface 116, all of which are rectangular shapes in each plan view. The fourth container surface 114 and the fifth container surface 115 are opposed to each other. The first container surface 111, the second container surface 112, the third container surface 113, and the sixth container surface 116 are arranged along four sides of the fourth container surface 114 and also four sides of the fifth container surface 115 and are perpendicular to the fourth container surface 114 and the fifth container surface 115. The first container surface 111 and the sixth container surface 116 are opposed to each other. The second container surface 112 and the third container surface 113 are opposed to each other.

The container 110 is made of, for example, a metal material having higher thermal conductivity such as aluminum alloy or magnesium alloy. Accordingly, the container 110 can dissipate heat from the light emitter 141 and the light reception member 142 from the surface of the container 110 and the heat dissipation efficiency of the container 110 can be increased. The container 110 may have a dust-proof function for preventing foreign substances from entering. In such a case, the container 110 is not completely sealed, and the gaps between the multiple members configuring the container 110 are filled by using a breathable dust-proof material such as a dust-proof sponge so that both the dust-proof effect and the effect of absorbing pressure fluctuation can be achieved. Further, each container surface of the container 110 may use the other members (e.g., a heat reception plate 151, a heat reception plate 152, a heat reception plate 153, a heat dissipation member 180, and a heat generator 140 described later) at a portion of each container surface. The sixth container surface 116 of the container 110 has an opening 116o to connect the container 110 and the space 168 described later.

The shape of the container 110 is not limited to a rectangular parallelepiped shape and may have other shapes as long as the container 110 has at least the first container surface 111, the second container surface 112 substantially perpendicular to the first container surface 111, and the third container surface 113 substantially perpendicular to the first container surface 111 and opposed to the second container surface 112. For example, the container 110 entirely has a substantially rectangular parallelepiped shape, but may have a shape in which a part of the rectangular parallelepiped shape is modified. For example, the container 110 may have a pentagonal prism shape in which one corner of a rectangular parallelepiped is removed or a shape in which a portion (e.g., the fourth container surface 114 or the fifth container surface 115) protrudes so as to cover the light-reception-and-heat-generation member larger than the container 110.

The light emitter 141 is disposed in the container 110 and generates heat at the time of light emission. Examples of the light emitter 141 includes a solid light source such as a laser light source, a laser diode (LD), or a light emitting diode (LED). Typically, a light source has an upper limit of temperature that allows the operation and is cooled below the upper limit temperature. In addition, a light source has a feature in which the light utilization efficiency is decreased with increasing the temperature. Herein, the light utilization efficiency is a ratio of the energy used for light output to the power consumption. Thus, in order to achieve a light source system having higher illuminance, the temperature of the light emitter is kept lower as much as possible even if the temperature of the light emitter is or lower than the upper limit temperature.

The light reception member 142 is disposed in the container 110 and generates heat by light reception (i.e., the light emitter irradiates the light reception member with the light beam). Examples of the light reception member 142 include a phosphor or a color filter. The light reception member 142 includes a base member having a function such as a light converter or a wavelength filter. In such a case, the base member may include a rotatable member or a still member. The base member may also include a light transmission member or a light reflection member.

The light reception member 142 typically generates heat when converting the first wavelength of the light beam emitted from the light emitter 141 into the second wavelength. In a case where the light reception member 142 is a phosphor, the lower the temperature of the phosphor is, the higher the light exchange efficiency is.

The light source device 100 according to the first embodiment, multiple light emitter 141 and multiple light reception member 142 are thermally connected to the heat dissipation member 180 as described below. Herein, the light emitter 141 and the light reception member 142 may be collectively referred to as the heat generator 140. Thus, in the light source device 100 according to the first embodiment, the container 110 includes four heat generators 140, and the exterior case 120 accommodates the light source device 100.

As illustrated in FIG. 1 and FIG. 2, in the first embodiment, a single light reception member 142*a* and a single light emitter 141*b* are disposed on the first container surface 111 of the container 110. Another single light emitter 141*a* is disposed on the second container surface 112 of the container 110, and another single light reception member 142*b* is disposed on the third container surface 113 of the container 110. Thus, in the light source device 100, the first container surface 111 of the container 110 includes two heat generators 140, the second container surface 112 includes one heat generator 140, and the third container surface 113 includes one heat generator 140.

In addition, for example, a holder may be disposed between the container 110 and the heat generator 140 described later in FIG. 7. However, preferably, the container 110 and the heat generator 140 are thermally connected to each other.

Among the members described above, the members attached to the container 110 (i.e., the light emitter 141, the light reception member 142, the heat dissipation members 181 182, and 183, the auxiliary heat dissipation members 185, 186*a*, and 186*b*, and the optical members 160) configure "the light source device 100".

In some embodiments, a light source device includes: four or more of heat generators; a container accommodating the four or more of heat generators, the container having: a first container surface; a second container surface perpendicular to the first container surface; and a third container surface perpendicular to the first container surface and opposed to the second container surface; multiple heat dissipation members outside the container, the multiple heat dissipation members to cool to the four or more of the heat generators; and an exterior case accommodating the container and the multiple heat dissipation members. The four or more of heat generators include: a first heat generator on the first container surface; a second heat generator on the first container surface; a third heat generator on the second container surface; a fourth heat generator on the third container surface. The multiple heat dissipation members include: a first heat dissipation member thermally connected to the first container surface; a second heat dissipation member thermally connected to the second container surface; and a third heat dissipation member thermally connected to the third container surface. The exterior case includes a first exterior surface opposed to the first heat dissipation member, the second heat dissipation member, and the third heat dissipation member. The first exterior surface of the exterior case exhausts air from the first heat dissipation member, the second heat dissipation member, and the third heat dissipation member.

In some embodiments, in the light source device, the first heat generator emits light to generate heat, and the second heat generator receives light to generate heat.

In some embodiments, in the light source device, the third heat generator emits light to generate heat, and the fourth heat generator receives light to generate heat.

In some embodiments, in the light source device, the container has one or more of container surfaces other than the first container surface, the second container surface, and the third container surface, the multiple heat dissipation members include one or more of auxiliary heat dissipation members.

Optical Path in the Light Source Device

An optical path in the light source device 100 according to the first embodiment will be described with reference to FIG. 1. Herein, as an example, a case where a blue laser light source is used for the light emitter 141 and a phosphor wheel is used for the light reception member 142 will be described.

The light emitter 141 disposed on the first container surface 111 of the container 110 emits a laser light beam. The laser light beam passes through the multiple optical members such as the optical lens 161 or the mirror 162 and strikes the light reception member 142. The light reception member 142 generates a fluorescent light beam by light reception (light irradiation).

The light source device 100 has two optical paths to the light reception member 142 from the light emitter 141. Two fluorescent light beams generated in the two optical paths pass through a light tunnel 164 and exits to the space 168 adjacent to the sixth container surface 116 and outside of the container 110. The light source device 100 may have another optical configuration in which a combination prism is disposed between the optical lens 161 or the mirror 162 and the light tunnel 163, and the two fluorescent light beams are combined (i.e., a combined fluorescent light beam) and pass through the light tunnel 164.

The combined fluorescent light beam emitted toward the space 168 strikes the image generation panel 165 disposed at the space 168. Accordingly, the image generation panel 165 generates an image, and the image is projected by the projection system 166.

Configuration of Heat Generator and Heat Dissipation Member

As illustrated in FIG. 1 and FIG. 2, three heat dissipation members (i.e., the heat dissipation member 181, the heat dissipation member 182, and the heat dissipation member 183) are disposed outside of the container 110. The heat dissipation member 181 is a member that mainly dissipates heat from the light emitter 141b and the light reception members 142a. The heat dissipation member 181 is thermally connected to the light emitter 141b and the light reception member 142a via a heat reception plate 151. The heat dissipation member 182 is a member that mainly dissipates heat from the light emitter 141a. The heat dissipation member 182 is thermally connected to the light emitter 141a via the heat reception plate 152. The heat dissipation member 183 is a member that mainly dissipates heat from the light reception member 142b. The heat dissipation member 183 is thermally connected to the light reception member 142b via the heat reception plate 153. In the first embodiment, the first heat dissipation member 131 includes the heat dissipation member 181 and the heat reception plate 151, the second heat dissipation member 132 includes the heat dissipation member 182 and the heat reception plate 152, and the third heat dissipation member 133 includes the heat dissipation member 183 and the heat reception plate 153.

The first container surface 111 of the container 110 is thermally connected to the heat dissipation member 181 that is one or more of the first heat dissipation members. The second container surface 112 of the container 110 is thermally connected to the heat dissipation member 182 that is one or more of the second heat dissipation member. The third container surface 113 of the container 110 is thermally connected to the heat dissipation member 183 that is one or more of the third heat dissipation member.

At least one of the three heat dissipation members 181, 182, or 183 has a heat dissipation fin having multiple unevenness. Specifically, at least one of the three heat dissipation members 181, 182, or 183 has a heat dissipation fin having multiple heat dissipation plates arranged. Herein, the multiple heat dissipation plates configures the multiple unevenness described above. The multiple heat dissipation plates are not parallel to the first container surface 111 of the container 110. The three heat dissipation members 181, 182, and 183 are described below in detail.

In some embodiments, in the light source device, at least one of the first heat dissipation member, the second heat dissipation member, or the third heat dissipation member includes multiple uneven portions.

In some embodiments, in the light source device, the multiple uneven portions include a heat dissipation fin including multiple heat dissipation plates.

In some embodiments, in the light source device, the multiple heat dissipation plates are inclined to the first container surface.

The heat reception plate 151 receives heat from the light emitter 141b and the light reception member 142a. The heat dissipation member 181 dissipates heat from the light emitter 141b and the light reception member 142a. In the first embodiment, a heat sink having a fin shape is used as the heat dissipation member 181 to increase an area of heat transmission, but is not limited thereto. The fin shape may have at least multiple unevenness, and examples of the fin shape includes plate fins, pin fins, or corrugated fins. In any case, the unevenness of the heat dissipation member 181 (the multiple heat dissipation plates) are not parallel to the first container surface 111 of the container 110. Preferably, the members configuring the first heat dissipation member 131 are connected to each other by a member having a thermal conductivity larger than a thermal conductivity of air, for example thermal paste, thermal sheet, or metal brazing. The same applies to the heat dissipation member 182 and the heat dissipation member 183 described below.

The heat dissipation member 181 has the surface 181s opposed to the first exterior surface 121 of the exterior case 120. For example, when the heat dissipation member 181 has the fin shape having multiple heat dissipation plates, the fin shape is formed at one end portion of the multiple heat plates.

As illustrated in FIGS. 1 and 2, the heat dissipation member 182 is disposed on the second container surface 112 of the container 110, and the heat dissipation member 183 is disposed on the third container surface 113 of the container 110. As with the case in the heat dissipation member 181, the unevenness shapes (i.e., the multiple heat dissipation plates) of the heat dissipation member 182 and the heat dissipation member 183 are arranged so as not to be parallel to the first container surface 111 of the container 110. According to such a configuration, when air is taken in or exhausted from the surface 181s of the heat dissipation member 181 (the first heat dissipation member), the surface 182s of the heat dissipation member 182 (the second heat dissipation member), and the surface 183s of the heat dissipation member 183 that are opposed to the first exterior surface 121 of the exterior case 120, the air flow is less likely to hinder, and higher heat dissipation performance can be achieved.

Other auxiliary heat dissipation members other than the heat dissipation member 181, the heat dissipation member 182, and the heat dissipation member to 183 may be disposed on one or more surfaces other than the first container surface 111, the second container surface 112, and the third container surface 113 of the container 110. For example, as illustrated in FIG. 2, the auxiliary heat dissipation member 185 is disposed on the fifth container surface 115 of the container 110. The auxiliary heat dissipation member 186a and the auxiliary heat dissipation member 186b may be arranged on the sixth container surface 116 of the container 110. As an example of the configuration, the auxiliary heat dissipation member 186a and the auxiliary heat dissipation member 186b are opposed to each other, and the opening 116o is between the auxiliary heat dissipation member 186a and the auxiliary heat dissipation member 186b. Examples of the auxiliary heat dissipation member include a heat sink having an unevenness shape or multiple heat dissipation plate arranged, a heat pipe, a heat pipe module, a liquid cooling device, or a Peltier element. The auxiliary heat dissipation member 185, the auxiliary heat dissipation member 186, and the auxiliary heat dissipation member 186b cool air in the container 110 (i.e., air cooling). Accordingly, air temperature in the container by the heat generator 140 is less likely to increase.

The auxiliary heat dissipation member may be disposed at other positions other than the positions of the container 110. For example, as illustrated in FIG. 2, the auxiliary heat dissipation member 187 is thermally connected to the image generation panel 165 on the back surface of the image generation panel 165 and mainly dissipates heat from the image generation panel 165.

Optical Path in the Light Source Device

Figure 3:
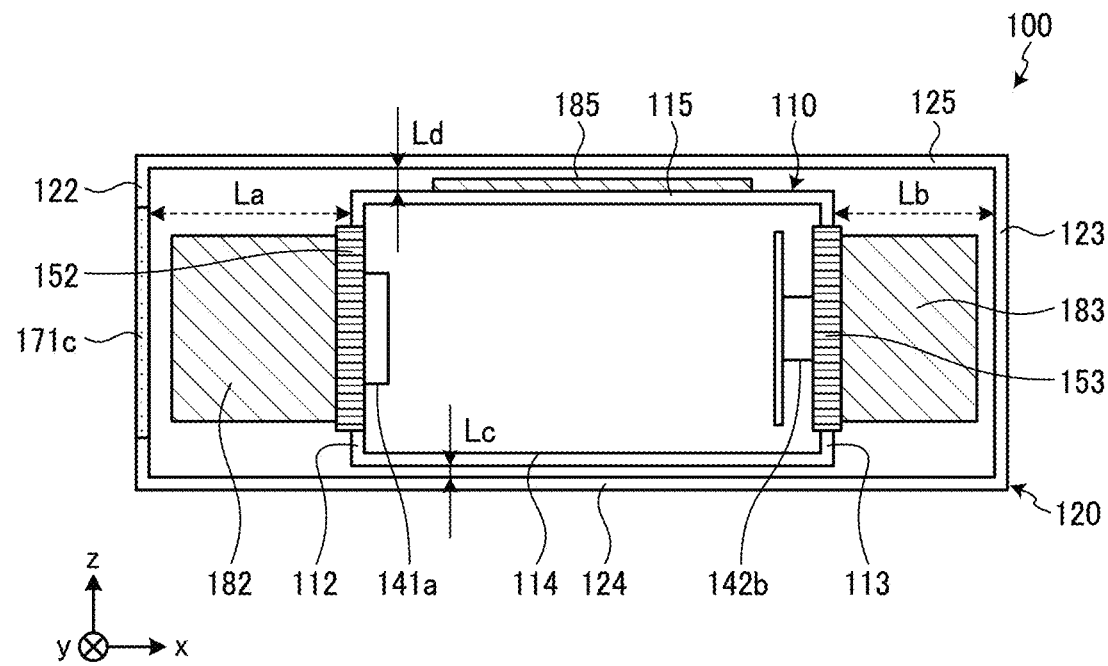
FIG. 3 is a cross-sectional view taken along the line A-A of the light source device in FIG. 2 as an example.
Figure 4:
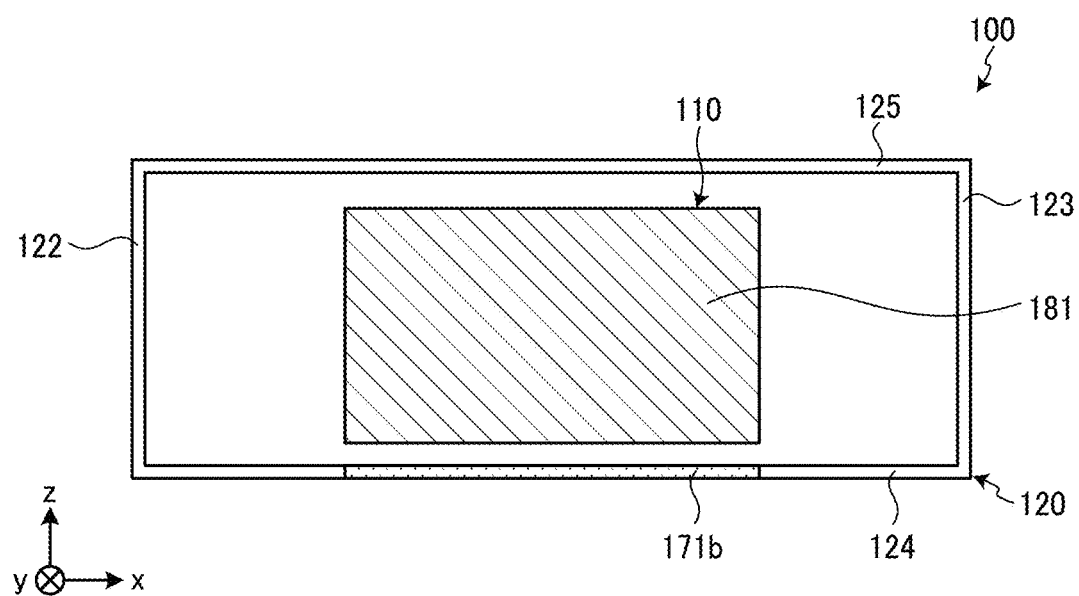
FIG. 4 is a cross-sectional view taken along the line B-B of the light source device in FIG. 2 as an example.
Figure 5:
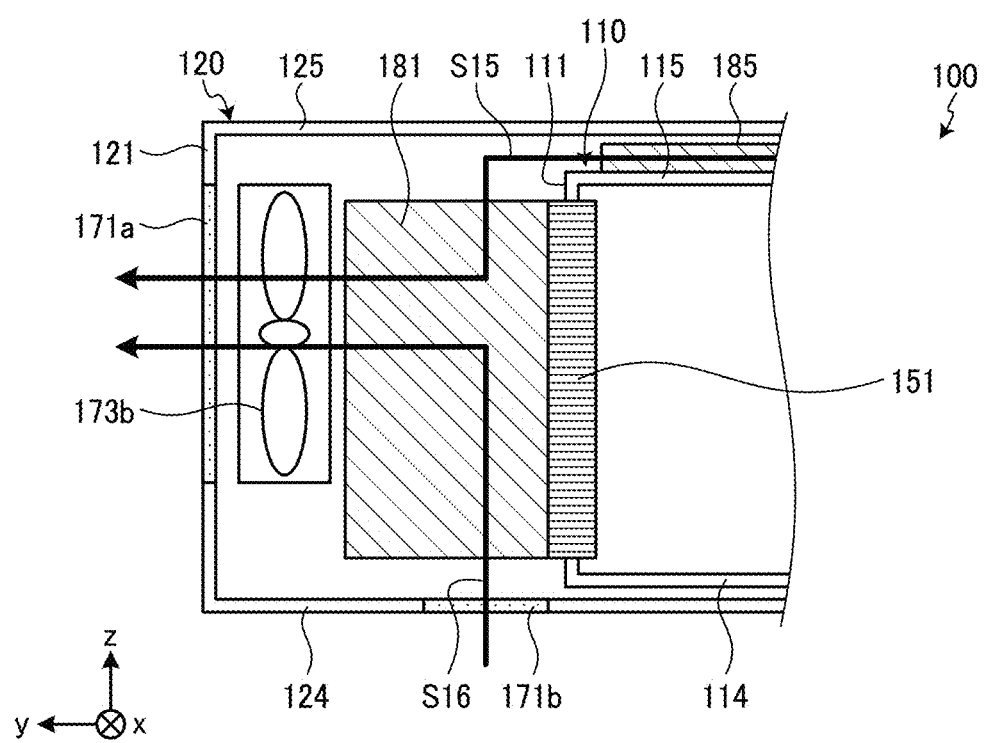
FIG. 5 is a cross-sectional view taken along the line C-C of the light source device in FIG. 2 as an example.
Figure 6:
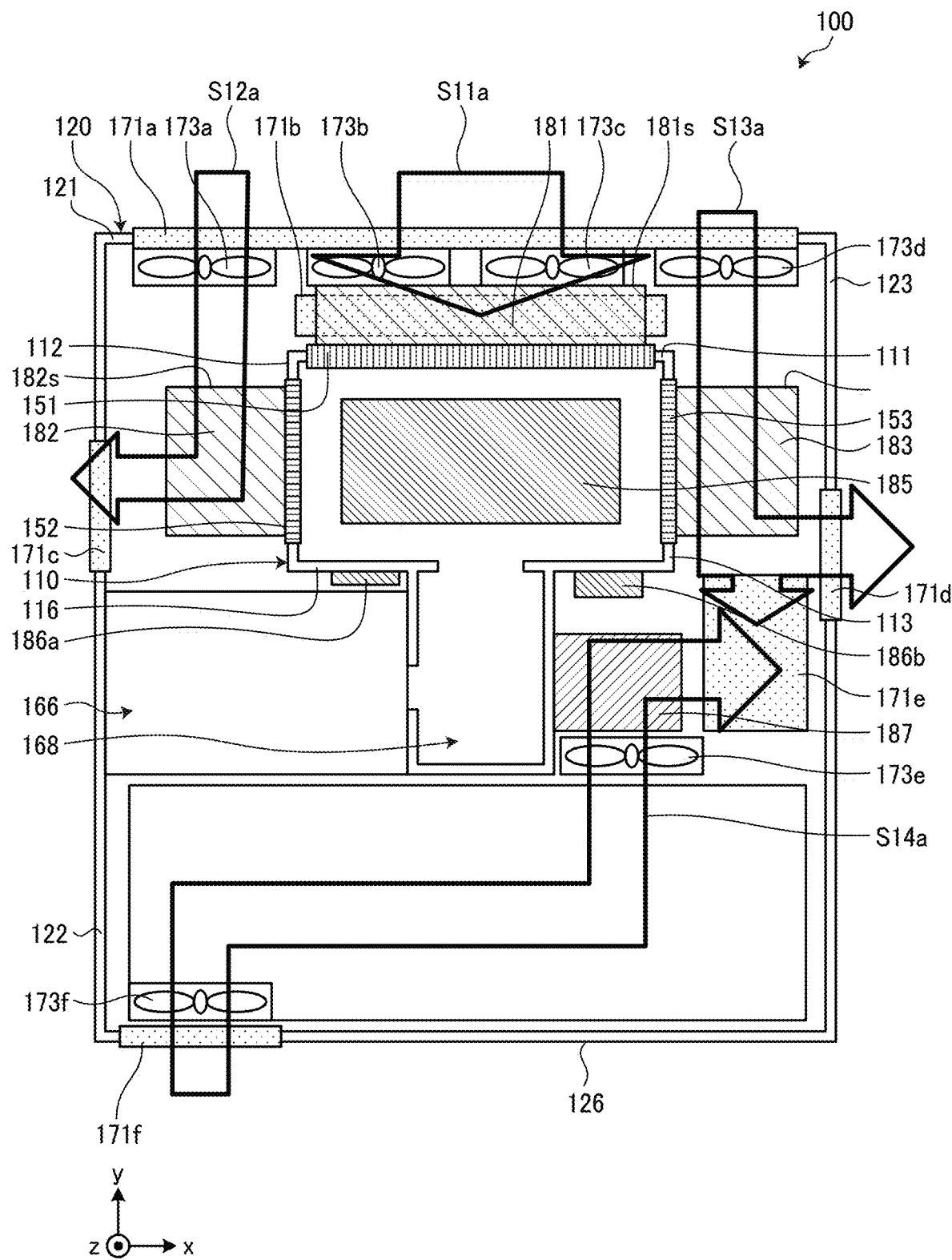
FIG. 6 is a diagram of an air flow path of the light source device according to the first embodiment another example.

An optical path in the light source device 100 will be described with reference to FIGS. 3 to 6. FIG. 3 is a cross-sectional view taken along the line A-A of the light source device in FIG. 2 as an example. FIG. 4 is a cross-sectional view taken along the line B-B of the light source device in FIG. 2 as an example. FIG. 5 is a cross-sectional view taken along the line C-C of the light source device in FIG. 2 as an example. FIG. 6 is a diagram of an air flow path of the light source device according to the first embodiment as another example. In the drawing after FIG. 3, some optical members may be omitted.

Each surface of the exterior case 120 has intake and exhaust ports 171a to 171f that are ports (holes) for intake or exhaust. The intake and exhaust ports 171a to 171f take air in from the outside of the exterior case 120, transfers heat from each heat dissipation member to the air, and exhausts the air having higher temperature to the outside of the exterior case 120 so to have a function to dissipate the heat in the exterior case 120.

As illustrated in FIG. 2, the intake and exhaust port 171a is arranged on the first exterior surface 121 opposed to the first container surface 111 of the container 110, the intake and exhaust port 171c is arranged on the second exterior surface 122 opposed to the second container surface 112 of the container 110, the intake and exhaust port 171d is arranged on the third exterior surface 123 opposed to the third container surface 113, and the intake and exhaust port 171f is arranged on the sixth exterior surface 126. The intake and exhaust port 171b and the intake and exhaust port 171e are arranged on the fourth exterior surface 124 of the exterior case 120 (FIG. 3).

In some embodiments, in the light source device, the first heat dissipation member includes a first heat dissipation plate parallel to the second container surface, the container includes a fourth container surface perpendicular to the first container surface, the second container surface, and the third container surface, the fourth container surface has an intake and exhaust port, the second heat dissipation member includes a second heat dissipation plate, the third heat dissipation member includes a third heat dissipation plate, the second heat dissipation plate and the third heat dissipation plate are parallel to the fourth container surface.

In some embodiments, in the light source device, the container includes: a fourth container surface perpendicular to the first container surface, the second container surface, and the third container surface; and a fifth container surface opposed to the fourth container surface. The exterior case further includes: a second exterior surface opposed to the second container surface; and a fourth exterior surface perpendicular to the first exterior surface and the second exterior surface, the third exterior surface, the fourth exterior surface opposed to the fourth container surface. The fourth exterior surface has an intake and exhaust port in a position adjacent to at least a portion of the first heat dissipation member.

Air flow generators are disposed at positions adjacent to each of the intake and exhaust ports 171a to 171f. The air flow generators 173a to 173f generate air flow taken or exhausted from the intake and exhaust ports 171a to 171f. The air flow generator may have a function to actively strike air flow to each of the heat dissipation members. Examples of the air flow generator typically include an axial flow fan and a sirocco fan, but are not limited thereto.

In some embodiments, in the light source device, further includes one or more of air flow generators between the first exterior surface and the first heat dissipation member.

As illustrated in FIG. 2, the air flow generators 173a to 173d (i.e., four air flow generators) are disposed at positions opposite to the first exterior surface 121 of the exterior case 120 and adjacent to the intake and exhaust port 171a. The air flow generator 173f is disposed at a position opposite to the sixth exterior surface 126 of the exterior case 120 and adjacent to the intake and exhaust port 171f. The air flow generator 173e is disposed in the air flow path S14 connected the intake and exhaust port 171e and the intake and the exhaust port 171f.

As illustrated in FIG. 2, air passing through the air flow paths S11, S12, and S13 is exhaust from the intake and exhaust port 171a. Air passing through the air flow path S12 is taken by the intake and exhaust port 171c from the outside of the second exterior surface 122 of the exterior case 120, air passing through air flow path S13 is taken by the intake and exhaust port 171d from the outside of the third exterior surface 123 of the exterior case 120.

As illustrated in FIGS. 2, 4, and 5, air passing through the air flow path S11 is mainly taken from the intake and exhaust port 171b disposed at the position opposed to the heat dissipation member 181 in the Z-direction. As a result, since air actively flows between the fins of the heat dissipation member 181 by the air flow flowing to the first exterior surface 121 of the exterior case 120 from the fourth exterior surface 124 of the exterior case 120, heat dissipation efficiency of the first heat dissipation member is increased.

As illustrated in FIGS. 2, the heat dissipation member 181 is disposed at the air flow path S11, the heat dissipation member 182 is disposed at the air flow path S12, and the heat dissipation member 183 is disposed at the air flow path S13. Thus, in the first embodiment, the heat dissipation member 181, the heat dissipation member 182, and the heat dissipation member 183 are separately disposed the air flow path S11, the air flow S12, and air flow S13, respectively. In other words, three heat dissipation members 181 to 183 are not arranged in a single air flow path in series.

As a result, since pressure loss of each of the air flow paths becomes smaller and the amount of the air flow passing through each of the heat dissipation members disposed at the each of the air flow paths is increased, heat from each of the heat dissipation members can be effectively dissipated. For example, the air flow exhausted from the first exterior surface 121 of the exterior case 120 generates independent air flow with respect to the first heat dissipation member 131 disposed on the first container surface 111 of the container 110, the second heat dissipation member 132 disposed on the second container surface 112 of the container 110, and the third heat dissipation member 133 disposed on the third container surface 113 of the container 110. As viewed from the direction perpendicular to the first container surface 111 of the container 110, since it is difficult to overlap the first heat dissipation member 131, the second heat dissipation member 132, and the third heat dissipation member 133, the air flow exhausted from the first exterior surface 121 of the exterior case 120 does not pass the first heat dissipation member 131, the second heat dissipation member 132, and the third heat dissipation member 133 in series, pressure loss of the air flow is less likely to increase. The amount of the air flow is increased by reducing the pressure loss of the air flow even if the same air flow generator (e.g., fan) is used. As a result, air velocity passing through the surface of the heat dissipation member is increased, and the heat dissipation efficiency for each heat dissipation member is increased. Accordingly, the light source device 100 having higher luminance and higher light use efficiency can be achieved. The air flow path may not be separated from each other and a portion of the air flow paths are intersected with each other.

As illustrated in FIGS. 2, 4, and 5, the air flow S15 passing between the fifth exterior surface 125 of the exterior case 120 and the fifth container surface 115 of the container 110 flows in the air flow path S11 in addition to the air flow S16 taken from the intake and exhaust port 171b. Accordingly, the cooling efficiency of the auxiliary heat dissipation member 185 disposed between the fifth exterior surface 125 of the exterior case 120 and the fifth container surface 115 of the container 110 can be increased.

The auxiliary heat dissipation member 187 illustrated in FIG. 2 is disposed in the air flow path S14 independent of the air flow paths S11, S12, and S13. According to such a configuration, the auxiliary heat dissipation member 187 can be cooled without interfering the heat dissipation efficiency of the heat dissipation member 181, the heat dissipation member 182 and the heat dissipation member 183. The air flow passing through the air flow path S14 also cools the electronic substrate 167 disposed between the air flow generator 173e and the air flow generator 173f.

As illustrated in FIGS. 1 and 2, the intake and exhaust port 171c is offset from the center position of the heat dissipation member 182 toward the negative Y-direction in the Y-direction. The intake and exhaust port 171d is offset from the center position of the heat dissipation member 183 toward the negative Y-direction in the Y-direction. According to such a configuration, the air flow flowing between the intake and exhaust port 171c and the intake and exhaust port 171a and between the intake and exhaust port 171d and the intake and exhaust port 171a easily flows through the gap between the heat dissipation plates of the heat dissipation members 182 and 183 disposed substantially perpendicular to the first container surface 111 of the container 110.

As illustrated in FIG. 3, a distance LA between the second container surface 112 of the container 110 and the second exterior surface 122 of the exterior case 120 is larger than a distance LC between the fourth container surface 114 of the container 110 and the fourth exterior surface 124 of the exterior case 120 and a distance LD between the fifth container surface 115 of the container 110 and the fifth exterior surface of the exterior case 120. Similarly, a distance LB between the third container surface 113 of the container 110 and the third exterior surface 123 of the exterior case 120 is larger than the distance LC and the distance LD. Thus, for the distances LA, LB, LC, and LD, expressions below are satisfied.

LA≥LC and LA≥LD, and

LB≥LC and LB≥LD

In some embodiments, in the light source device, an expressions below are satisfied:

LA≥LC and LA≥LD, and

LB≥LC and LB≥LD, where

LA is a distance between the second container surface and the second exterior surface, LB is a distance between the third container surface and the third exterior surface, LC is a distance between the fourth container surface and the fourth exterior surface, and LD is a distance between the fifth container surface and the fifth exterior surface.

Accordingly, when a space between the second container surface 112 of the container 110 and the second exterior surface 122 of the exterior case 120 or a space between the third container surface 113 of the container 110 and the third exterior surface 123 of the exterior case 120 is larger than a space between the fourth container surface 114 of the container 110 and the fourth exterior surface 124 of the exterior case 120 or a space between the fifth container surface 115 of the container 110 and the fifth exterior surface 125 of the exterior case 120, a large portion of air flow flowing through a space between the exterior case 120 and the container 110 flows the space between the second container surface 112 of the container 110 and the second exterior surface 122 of the exterior case 120 or the space between the third container surface 113 of the container 110 and the third exterior surface 123 of the exterior case 120. As a result, since air flow flowing the second heat dissipation member 132 and the third heat dissipation member 133 increases, the heat dissipation performance increases.

The direction of the air flow is not limited to the direction of the air flow illustrated in FIG. 2. As illustrated in FIG. 6, the intake and exhaust port 171a and the intake and exhaust port 171e may take air, and the intake and exhaust ports 171b, 171c, 171d, and 171f may exhaust the air. In such a case, the direction of the air flow path in the light source device 100 in FIG. 6 is opposed to the direction of the air flow path in FIG. 2. Similarly, in other embodiments described below, the directions of intake and exhaust of air may be switched.

In the air flow path illustrated in FIG. 2, since the air containing a large amount of heat that strikes the heat dissipation members 181, 182, and 183 is immediately exhausted from the intake and exhaust ports 171a, hot air is less likely to be trapped inside the exterior case 120. By contrast, in another air flow path illustrated in FIG. 6, since the low-temperature air taken from the intake and exhaust port 171a firstly strikes the heat dissipation member 181, the heat dissipation performance of the heat dissipation member 181 can be increased.

MODIFICATION

As described above, preferable embodiments of the present invention have been described in detail. However, the present invention is not limited to these embodiments, and various modifications or changes are made within the scope of the present invention described in the claims below. For example, the light source device 100 may include four or more heat generators. In any case, it is preferable that the first container surface of the container includes one or more of the light emitters and one or more of the light reception members, the second container surface of the container includes one or more of the light emitters, and the third container surface includes one or more of the light reception members.

Further, the positions on which the intake and exhaust ports or the fans are disposed are not limited to the positions illustrated in the drawings. For example, the intake and exhaust port or the fan may be disposed on the fifth exterior surface of the exterior.

Figure 7A:
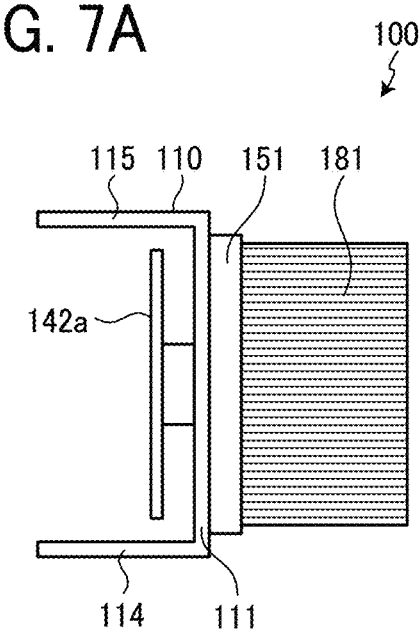
FIG. 7A is a cross-sectional view taken along the line A-A of the light source device in FIG. 2 as a modification.

In each embodiment, the light emitter 141 and the light reception member 142 are disposed on the inner surface of each surface of the container 110 as illustrated in FIG. 7A. However, the embodiment is not limited thereto. FIG. 7A is a cross-sectional view taken along the line A-A of the light source device in FIG. 2 as a modification. For example, as illustrated in FIG. 7B, in the first modification, the opening 117o is arranged on the first container surface 117 of the container 110, and the light reception member 142a may be directly connected to the heat reception plate 151 disposed on the outside of the first container surface 117 of the container 110.

Figure 7B:
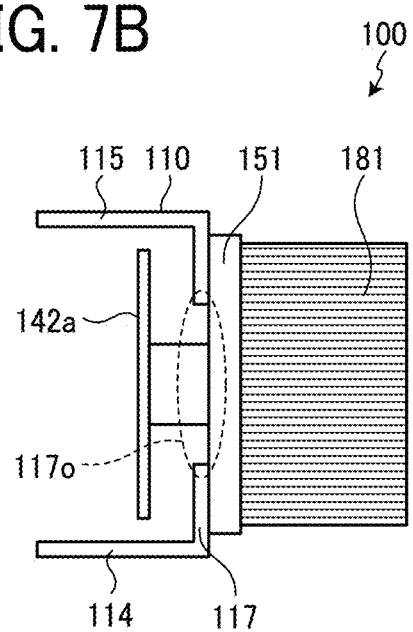
FIG. 7B is a cross-sectional view taken along the line A-A of the light source device in FIG. 2 as a first modification.
Figure 7C:
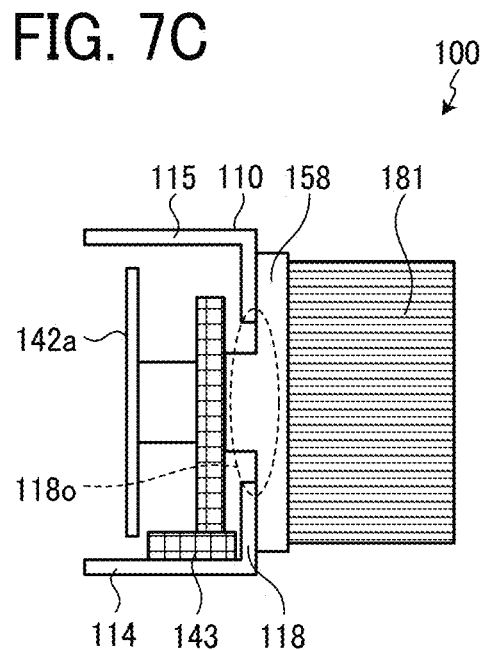
FIG. 7C is a cross-sectional view taken along the line A-A of the light source device in FIG. 2 as a second modification.

As illustrated in FIG. 7C, in the second modification, the light reception member 142 is held by a jig 143. The jig 143 is attached to, for example, the fourth container surface 114 of the container 110 and is connected to the heat reception plate 158 via the opening 118o arranged on the first container surface 118. Accordingly, the light reception member 142 is thermally connected to the heat reception plate 158.

Figure 7D:
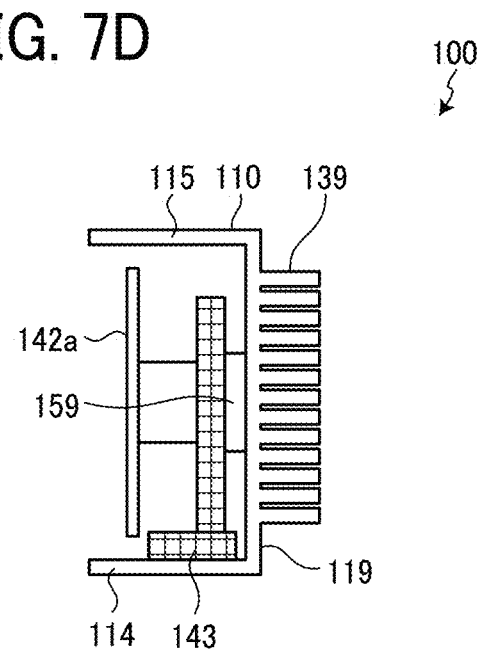
FIG. 7D is a cross-sectional view taken along the line A-A of the light source device in FIG. 2 as a third modification.

As illustrated in FIG. 7D, in the third modification, multiple heat dissipation fins 139 are formed on the first container surface 119 of the container 110. As a result, heat can be dissipated from the light reception member 142a without connecting to other heat dissipation members. In such a case, the jig 143 and the first container surface 119 are thermally connected to the thermal connection member 159.

Each modification illustrated in FIGS. 7B to 7D is an example. For example, in a configuration without the jig 143, the heat dissipation fin may be disposed on the first container surface 111 of the container 110.

Second Embodiment

The second embodiment will be described.

The heat dissipation efficiency of is increased in a case where each heat dissipation member 130 is connected to a single heat generator 140 as compared with a case where each heat dissipation member 130 is connected to multiple heat generators 140. Further, since the amount of the heat dissipation of the light emitter 141 is typically larger than that of the light reception member 142, it is preferable that the heat dissipation area of the light emitter 141 is larger than that of light reception member 142. In the second embodiment, the light emitter 141 is thermally connected to multiple heat dissipation members using, for example, a heat transportation member such as a heat pipe, or thermal resistance of the tip of the heat dissipation member having a larger heat dissipation area is decreased. The second embodiment is different from the first embodiment in this point. In the following description of the second embodiment, the description of the same configurations as in the first embodiment will be omitted, and those different from the first embodiment will be described.

Figure 8:
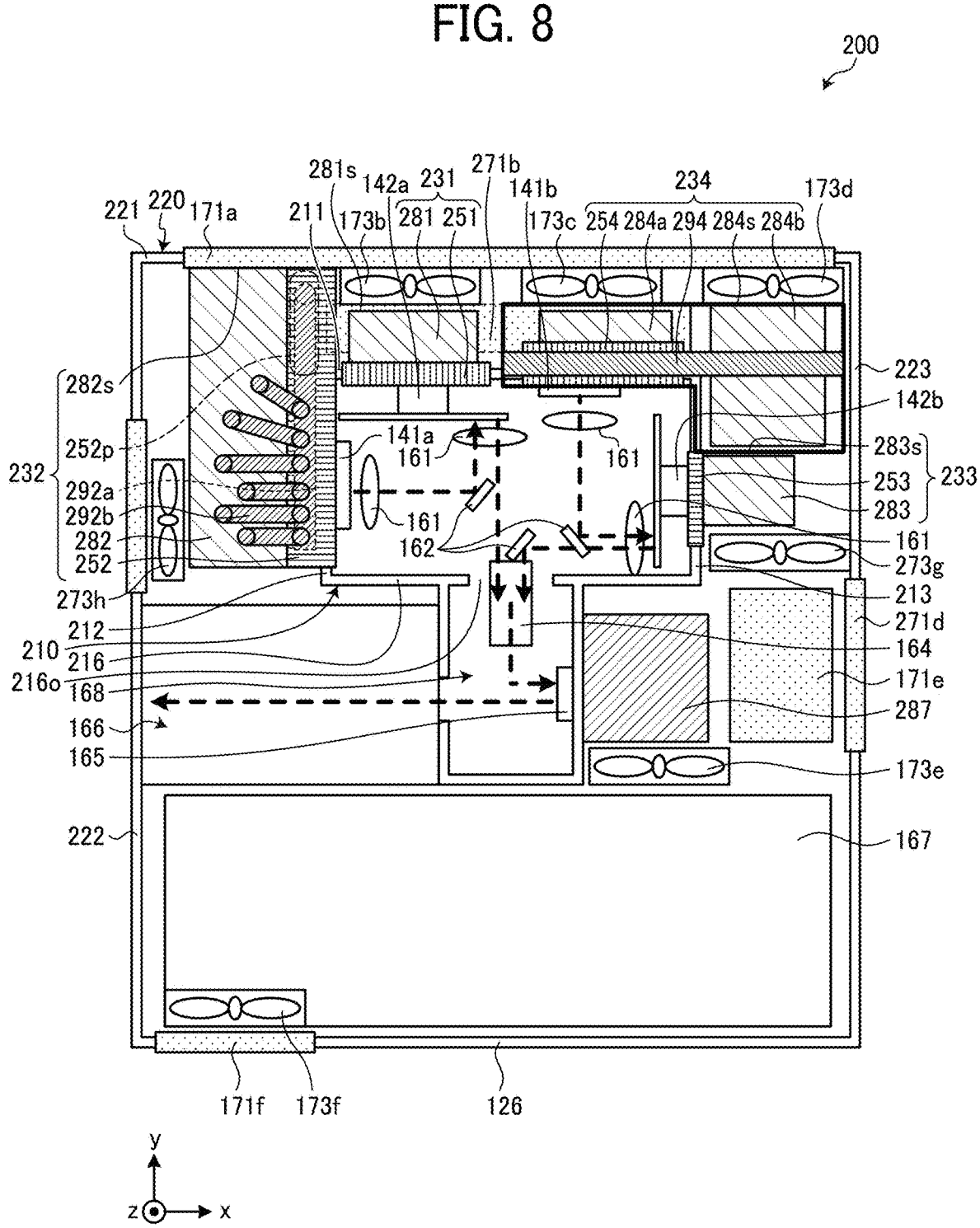
FIG. 8 is a diagram of an inner configuration of the light source device according to a second embodiment as an example.
Figure 9:
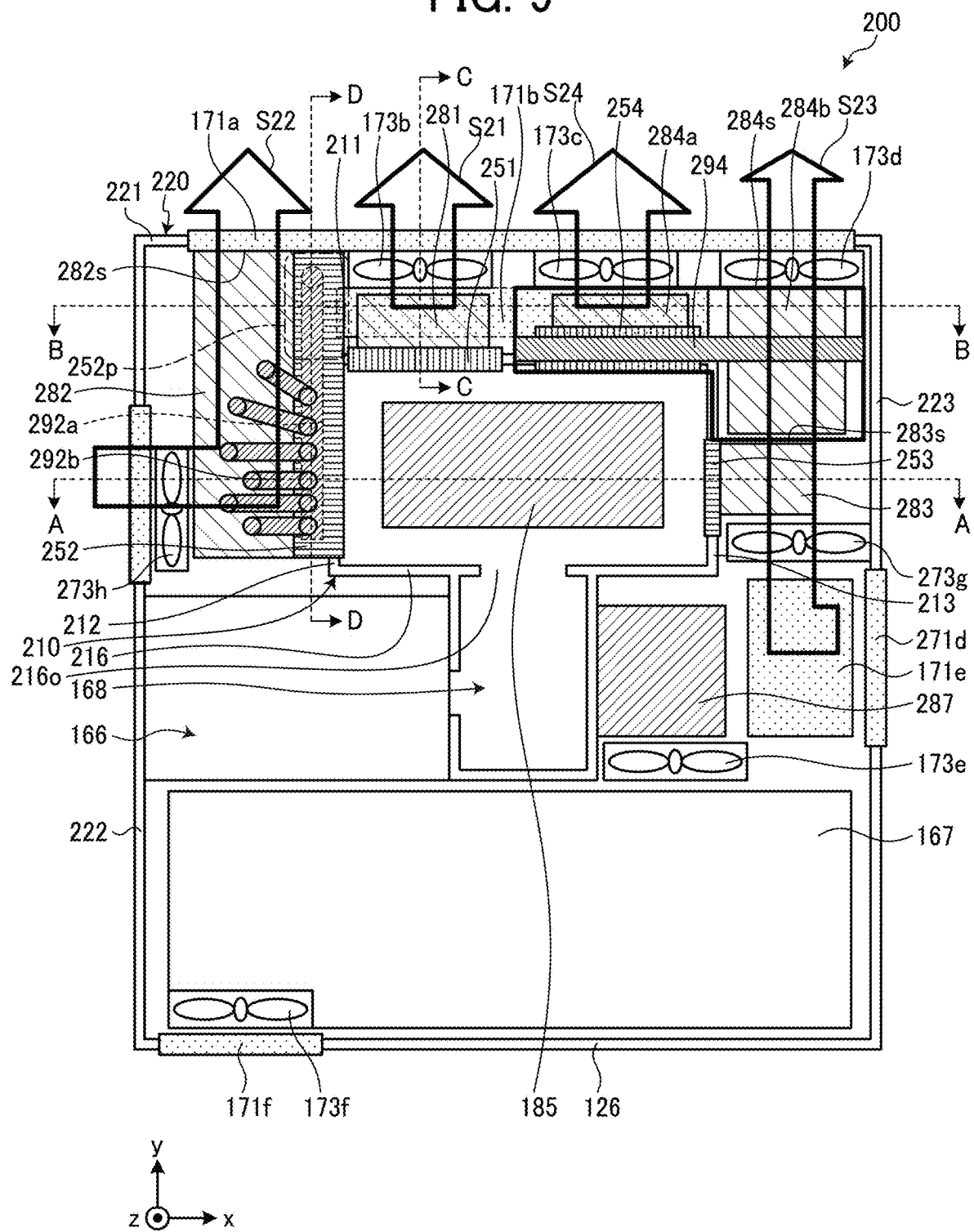
FIG. 9 is a diagram of an air flow path of the light source device according to the second embodiment as an example.
Figure 10:
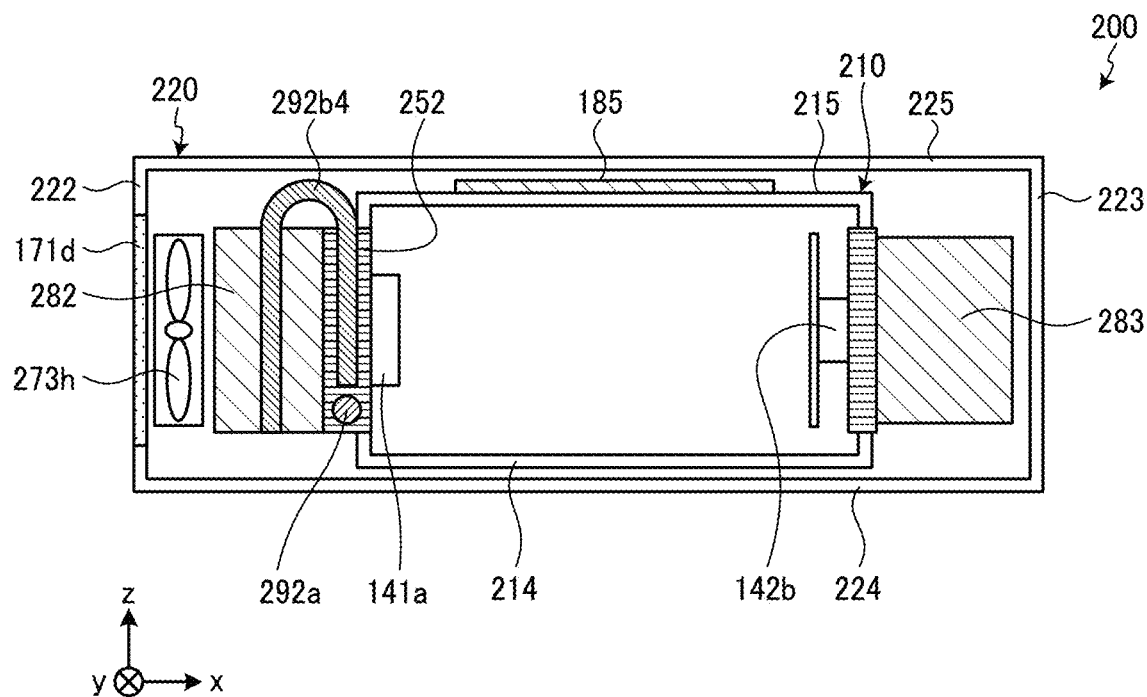
FIG. 10 is a cross-sectional view taken along the line A-A of the light source device in FIG. 9 as an example.
Figure 11:
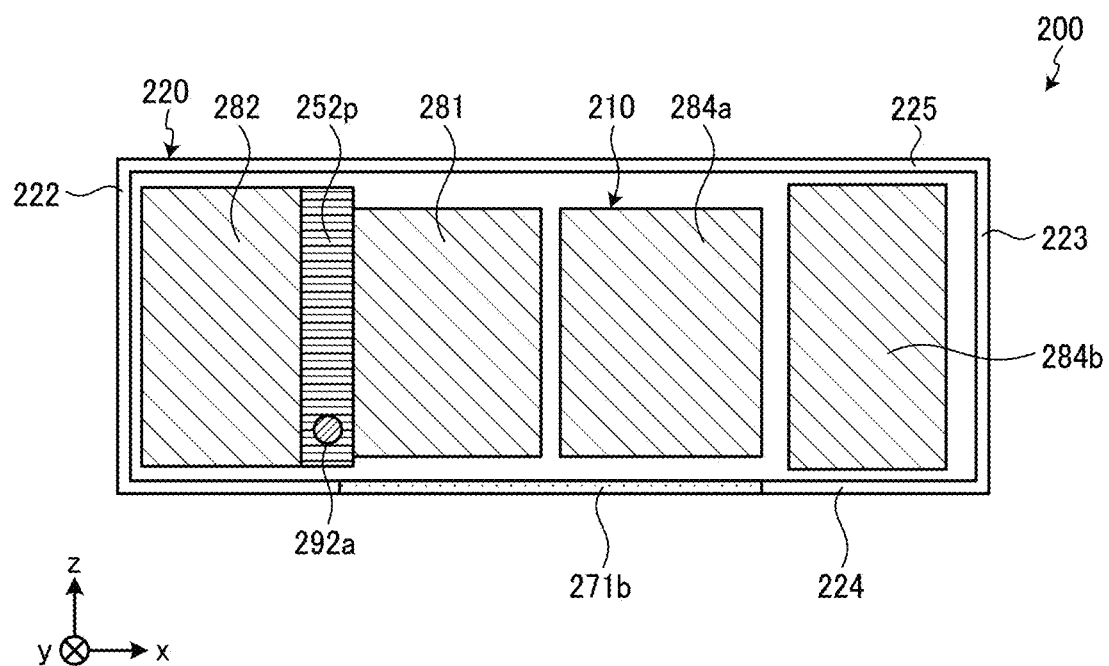
FIG. 11 is a cross-sectional view taken along the line B-B of the light source device in FIG. 9 as an example.
Figure 12:
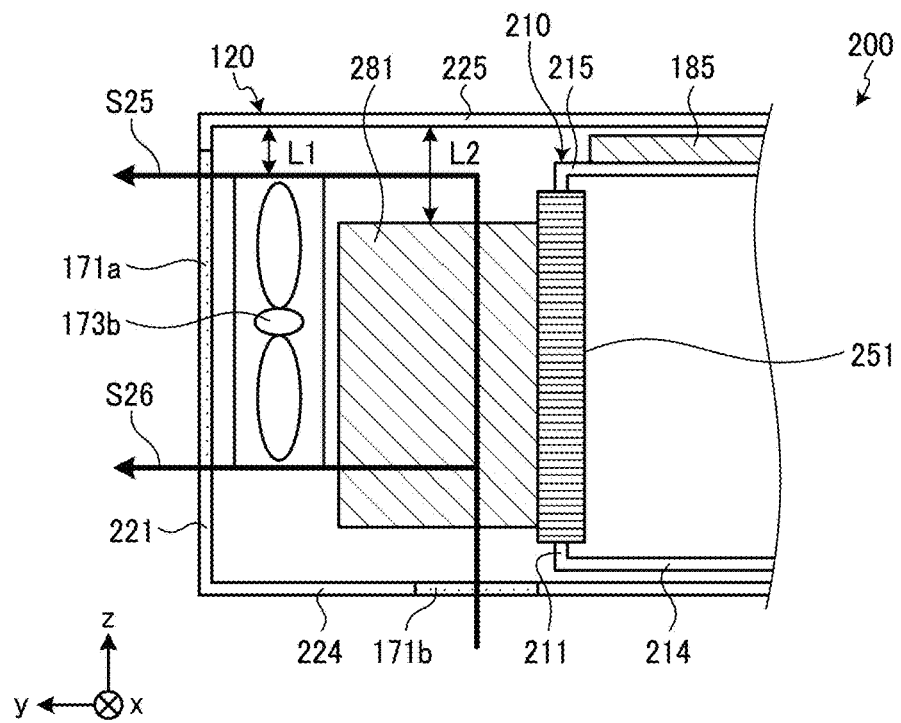
FIG. 12 is a cross-sectional view taken along the line C-C of the light source device in FIG. 9 as an example.
Figure 13:
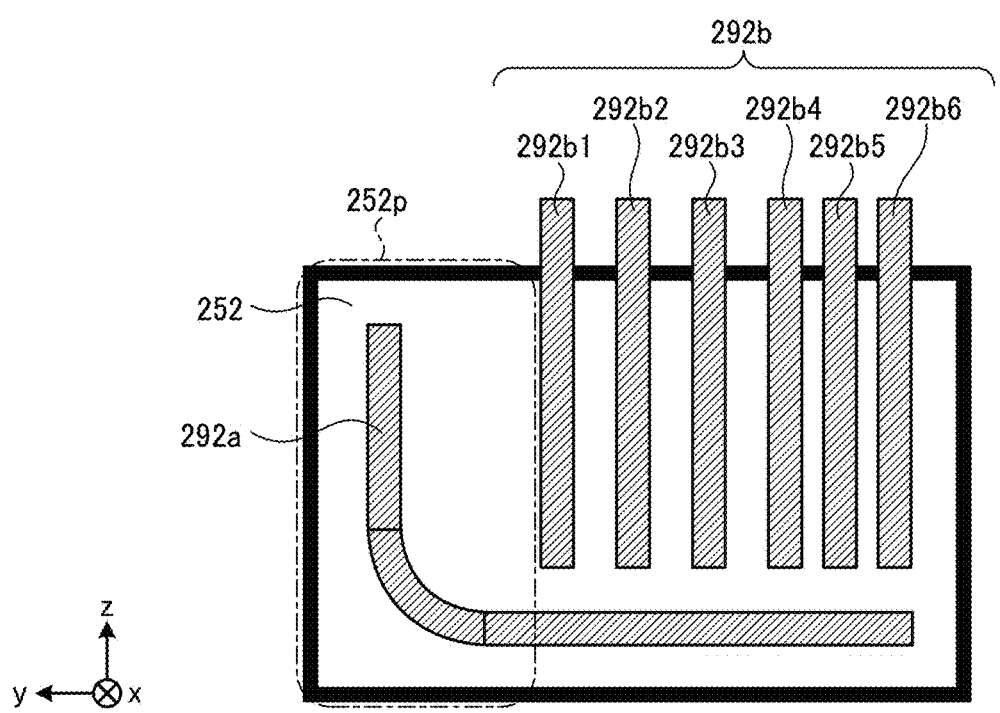
FIG. 13 is a cross-sectional view taken along the line D-D of the light source device in FIG. 9 as an example.

Different points in the light source device 200 according to the second embodiment as compared with the light source device 100 according to the first embodiment will be described below. FIG. 8 is a diagram of an inner configuration of the light source device according to a first embodiment as an example. FIG. 9 is a diagram of an air flow path of the light source device according to the first embodiment as an example. FIG. 10 is a cross-sectional view taken along the line A-A of the light source device in FIG. 9 as an example. FIG. 11 is a cross-sectional view taken along the line B-B of the light source device in FIG. 9 as an example. FIG. 12 is a cross-sectional view taken along the line C-C of the light source device in FIG. 9 as an example. FIG. 13 is a cross-sectional view taken along the line D-D of the light source device in FIG. 9 as an example.

As illustrated in FIG. 8, the light source device 200 according to the second embodiment includes four heat generators, that is, the light emitter 141a, the light emitter 141b, the light reception member 142a, and the light reception member 142b. Further, the first container surface 211 of the container 210 includes two heat generators 140 (i.e., the light reception member 142a and the light emitter 141b), the second container surface 212 includes the heat generator 140 (i.e., the light emitter 141a), and the third container surface 213 includes the heat generator 140 (i.e., the light reception member 142b). In the second embodiment, the sixth surface 216 does not include an auxiliary heat dissipation member but has an opening 116o.

The first container surface 211 of the container 210 is thermally connected to the heat dissipation member 281 via the heat reception plate 251. The first container surface 211 is thermally connected to the heat dissipation member 284a via the heat reception plate 254. The first container surface 211 is thermally connected to the heat dissipation member 284a via the heat reception plate 254 and the heat transportation member 294 of a heat pipe. The heat transportation member 294 transfers heat to the heat reception plate 254. In the second embodiment, the first heat dissipation member 231 includes the heat dissipation member 281 and the heat reception plate 251. The fourth heat dissipation member 234 includes the heat dissipation members 284a and 284b, the heat reception plate 254, and the heat transportation member 294.

In such a case, among the two heat generators disposed on the first container surface 211 of the container 210, the light reception member 142a is thermally connected to the heat dissipation member 281, and the light emitter 141b is thermally connected to the heat dissipation member 284a. Thus, each of the light reception member 142a and the light emitter 141b is thermally connected to the different heat dissipation members.

In some embodiments, in the light source device, the multiple heat dissipation members include first multiple heat dissipation members, the first heat generator is thermally connected to one or more of the first multiple heat dissipation members, the second heat generator is thermally connected to other of the first multiple heat dissipation members different from the first multiple heat dissipation members thermally connected to the first heat generator.

According to such a configuration, for the two heat generators, the light emitter 141b and the light reception member 142a are separately connected to the heat dissipation members (i.e., one by one). Accordingly, when the target temperature of the light emitter 141b and the target temperature of the light reception member 142a are different, it is easy to independently control the temperature of the light emitter 141b and the temperature of the light reception member 142a.

Further, the light emitter 141b is thermally connected to the heat dissipation member 284 in addition to the heat dissipation member 284a. In such a case, the total heat dissipation area adding the area of the heat dissipation member 284a and the area of the heat dissipation member 284b, which are thermally connected to the light emitter 141b, is larger than the heat dissipation area of the heat dissipation member 281 thermally connected to the light reception member 142a. In such a case, since the heat generator is thermally connected to two or more of the heat dissipation members, the heat dissipation area becomes larger, and the heat dissipation efficiency is increased.

As illustrated in FIGS. 8 and 9, in the container 210, the light reception member 142b disposed on the third container surface 213 of the container 210 substantially perpendicular to the first container surface 211 of the container 210 is thermally connected to the heat dissipation member 283 via the heat reception plate 253. In the second embodiment, the third heat dissipation unit 233 includes the heat dissipation member 283 and the heat reception plate 253.

In such a configuration, the heat dissipation member 281, the heat dissipation member 282, and the heat dissipation member 284 are disposed in the air flow path S22, the air flow path S21, and the air flow path S23, respectively. Herein, the air flow path S22, the air flow path S21, and the air flow path S23 are independent of each other. By contrast, the heat dissipation member 284b and the heat dissipation member 283 are disposed in the air flow path S23 in series. However, even in such a case, the heat dissipation efficiency can be increased as compared with the case where all the heat dissipation member are arranged in series on one air flow path.

As illustrated in FIGS. 8 and 9, in the container 210, the light emitter 141a disposed on the second container surface 212 of the container 210 substantially perpendicular to the first container surface 211 of the container 210 is thermally connected the heat dissipation member 282 via the heat reception plate 252. As illustrated in FIG. 9, the heat dissipation member 282 has a heat dissipation area larger than the area of the heat dissipation member 182 according to the first embodiment. Specifically, the heat reception plate 252 includes a protrusion portion 252p protruding to the positive Y-direction. The protrusion portion 252p is adjacent to the heat dissipation member 281 in the X-direction.

In some embodiments, in the light source device, the second heat dissipation member includes a heat reception plate receives heat from the second heat generator, the heat reception plate includes a protrusion portion protruded from the second container surface in a direction perpendicular to the second container surface, and the protrusion portion is adjacent to the first heat dissipation member.

When the area of the heat dissipation member 282 directly connected to the heat reception plate 252 is larger, the temperature of the tip of the protrusion portion 282p away from the light emitter 141a of the heat generator becomes lower, and the heat dissipation performance may be reduced. Thus, in the second embodiment, as illustrated in FIGS. 9 and 13, the heat reception plate 252 includes a heat transportation members 292a and 292b such as heat pipes. The heat transport member 292a extends to a position corresponding to the protrusion portion 282p in the Y-direction. In the second embodiment, the second heat dissipation unit 232 includes the heat dissipation member 282, the heat reception plate 252, and the heat transportation members 292a and 292b. As a result, since the thermal resistance of the tip of the protrusion portion 282p of the heat dissipation member 282 is decreased, the heat dissipation efficiency can be increased.

In some embodiments, in the light source device, the first exterior surface opposed to the first container surface has an intake and exhaust port.

In an example illustrated in FIG. 12, an expression below is satisfied.

$$L1 \leq L2$$

where L1 is a distance between an end surface of the one or more of air flow generator 173b facing the fifth exterior surface 225 and the fifth exterior surface 225, and L2 is a distance between an end surface of the first heat dissipation member 281 facing the fifth exterior surface and the fifth exterior surface. In such a configuration, air is taken from the intake and exhaust port 171b arranged on the fourth exterior surface 224 of the exterior case 220 and is exhausted from the intake and exhaust port 171a of the first exterior surface 221 of the exterior, and air flows to the fifth exterior surface 225 of the exterior case 220 in the Z-direction. For example, the air flow exhausted from the intake and exhaust port 171a passes through the heat dissipation member 281 along the Y-direction and the Z-direction, the air flow path S26 at the side of the negative Z-direction and the air flow path S25 at the side of the positive Z-direction. Accordingly, the distance through which the air flow passes between the fins of the heat dissipation member 281 becomes longer. As a result, the average of the surface area of the air flow velocity blowing over the surface area of the heat dissipation member 281 becomes larger so that the heat dissipation efficiency of the heat dissipation member 281 is increased.

In some embodiments, in the light source device, the exterior case includes a fifth exterior surface opposed to the fourth exterior surface, and an expression below is satisfied:

$$L1 \leq L2,$$

where
L1 is a distance between an end surface of the one or more of air flow generators facing the fifth exterior surface and the fifth exterior surface, and
L2 is a distance between an end surface of the first heat dissipation member facing the fifth exterior surface and the fifth exterior surface.

As illustrated in FIGS. 9 and 10, in the second embodiment, since the air flow generator 273h is also disposed between the heat dissipation member 282 and the second exterior surface 222 of the exterior case 220, temperature of the end portion of the heat dissipation member 282 in the negative X-direction is decreased. The heat dissipation performance is increased by reducing the thermal resistance of the end portion of the heat dissipation member 282 from the heat reception plate 252 in the negative X-direction.

When the heat transport member is a heat pipe, since it is difficult to directly attach the heat generator 140 to the heat pipe, a heat reception plate is typically interposed between the heat transport member and the heat generator 140. The light emitter 141a is thermally connected to the heat reception plate 252. The heat reception plate 252 is thermally connected to the heat transportation member 292a and the heat dissipation member 282. The heat transportation member 292a and the heat transportation member 292b are thermally connected to the heat dissipation member 282. Preferably, a substance having a smaller thermal conductivity than thermal conductivity of air, for example, thermal conductive grease, thermal conductive sheet, or brazing metal, is inserted between the members to connect the members in order to reduce thermal resistance.

In some embodiments, the light source device, further includes: a heat reception member to receive heat from at least one of the four or more of heat generators; and a heat transportation member to transport heat from the heat reception member to at least one of the multiple heat dissipation members. At least one of the first heat dissipation member, the second heat dissipation member, or the third heat dissipation member is thermally connected to any one of the four or more of heat generators via the heat reception member or the heat transportation member.

In some embodiments, in the light source device, the heat reception member has an uneven shape or a fin shape, and the heat transportation member includes a heat pipe.

Also in the second embodiment, the surface 281s of the heat dissipation member 281, the surface 282s of the heat dissipation member 282, the surface 283s of the heat dissipation member 283, and the surfaces 284s of the heat dissipation member 284a and the heat dissipation member 284b are opposed to the intake and exhaust port 171a arranged on the first exterior surface 221 of the exterior case 220. As a result, heat can be efficiently dissipated from each heat dissipation member.

In the second embodiment, the heat dissipation plate of the heat dissipation fin of the heat dissipation member 281 is arranged to be substantially perpendicular to the heat dissipation plate of the heat dissipation fin of the heat dissipation member 282 and the heat dissipation plates of the heat dissipation fin of the heat dissipation member 283. For example, when the heat dissipation plate of the heat dissipation member 281 is substantially parallel to the second container surface 212 of the container 210 (i.e., the heat dissipation plate extends to the YZ-plane), the heat dissipation plate of the heat dissipation member 282 and the heat dissipation plate of the heat dissipation member 283 are substantially parallel to the fourth container surface 214 of the container 210 (i.e., the heat dissipation plate extends to the XY-plane). According to the configuration of the heat dissipation plates described above, since the air flow taken from the intake and exhaust port 171b of the fourth container surface 214 can easily pass through the heat dissipation member 281, and the air flow taken from the intake and exhaust port 271c of the second container surface 212 can easily pass through the heat dissipation member 282, the amount of the air flow to strike the heat dissipation member 281 and the heat dissipation member 283 increases.

In some embodiments, in the light source device, the first heat dissipation member includes the multiple heat dissipation plates including first heat dissipation plates, the second heat dissipation member includes the multiple heat dissipation plates including second heat dissipation plates, and the third heat dissipation member includes the multiple heat dissipation plates including third heat dissipation plates. The second heat dissipation plates and the third heat dissipation plates are perpendicular to the first heat dissipation plates. The exterior case includes: a second exterior surface opposed to the second container surface and having an intake and an exhaust port, a third exterior surface opposed to the third container surface and having another intake and another exhaust port.

Third Embodiment

The third embodiment will be described.
The third embodiment is different from the first embodiment in an air flow path. In the third embodiment, the description of the same configurations as in the first embodiment will be omitted, and those different from the first embodiment will be described below.

Figure 14:
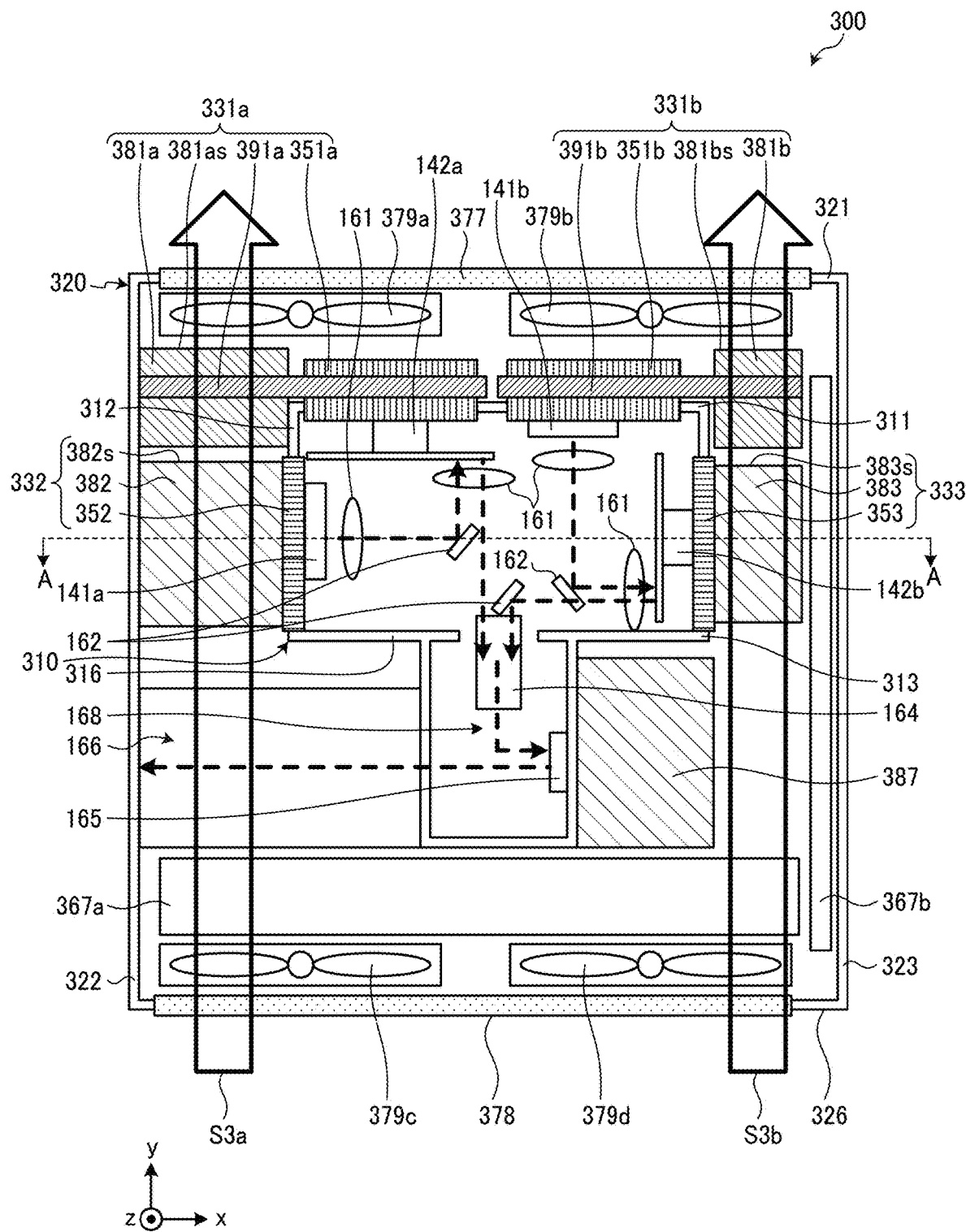
FIG. 14 is a diagram of an inner configuration and an air flow path of the light source device according to the third embodiment as an example.
Figure 15:
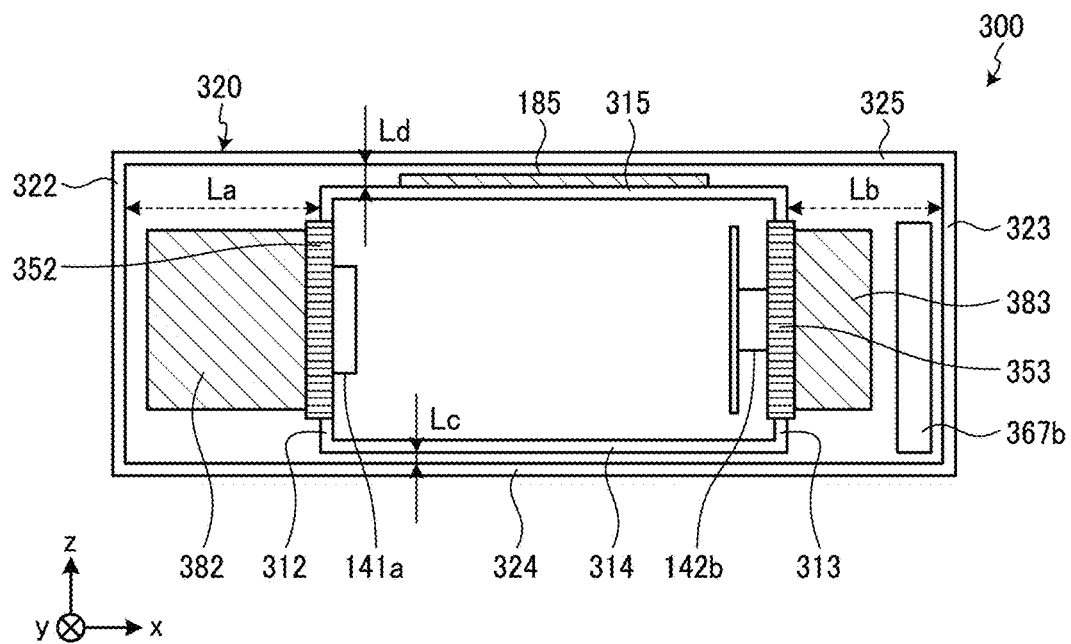
FIG. 15 is a cross-sectional view taken along the line A-A of the light source device in FIG. 14 as an example.

Different points of the light source device 300 according to the third embodiment as compared with the light source device 100 according to the first embodiment will be described below. FIG. 14 is a diagram of an inner configuration and air flow paths of the light source device according to the third embodiment as an example. FIG. 15 is a cross-sectional view taken along the line A-A of the light source device in FIG. 14 as an example.

In the third embodiment, a first portion 331a of the first heat dissipation member 331 includes the heat dissipation member 381a, the heat reception plate 351, and the heat transportation member 391a, and a second portion 331b of the first heat dissipation member 331 includes the heat dissipation member 381b, the heat reception plate 351b, and the heat transportation member 391b. The second heat dissipation member includes the heat dissipation member 382 and the heat reception plate 352, and the third heat dissipation member 333 includes the heat dissipation member 383 and the heat reception plate 353.

Air Flow Path in the Light Source Device

In the light source device 300 according to the third embodiment, for example, when air is taken from the intake and exhaust port 378 and is exhausted from the intake and exhaust port 377, the air flow path in the light source device 300 has air flow paths S3a and S3b as illustrated in FIG. 14.

In the air flow path S3a, air taken from the intake and exhaust port 378 by the air flow generator 379c cools the electronic substrate 367a, the projection system 166, the second heat dissipation member 332, and a first portion 331a of the first heat dissipation member in this order and is exhausted from the intake and exhaust port 377.

In the air flow path S3b, air taken from the intake and exhaust port 378 by the air flow generator 379d cools the electronic substrate 367a, the auxiliary heat dissipation member 387, the third heat dissipation member 333, and a second portion 331b of the first heat dissipation member and is exhausted from the intake and exhaust port 378. Also, gas passing through the air flow path S3b cools another electronic substrate 367b.

In the third embodiment, the third exterior surface 223 of the exterior 2220 does not have the intake and exhaust port, another electronic substrate 367b different from the electronic substrate 367a is disposed between the third container surface 213 of the container 210 and the third exterior surface 123 of the exterior case 220. As described above, by disposing the electronic substrate 367b on an exterior surface of the exterior case 220 without the intake and exhaust port, it is easy to provide an interface function on the electronic substrate 367b to the outside of the exterior case 220. In addition, since the size of the electronic substrate 367a can be smaller than that of the electronic substrate 167 in the other embodiments, the area of the auxiliary heat dissipation member 387 can be increased.

In the third embodiment, the surface 381as of the heat dissipation member 381a of the first portion 331a of the first heat dissipation member and the surface 382s of the heat dissipation member 382 of the second heat dissipation member 332 are disposed at the same air flow path S3a, and the surface 381bs of the heat dissipation member 381b of the second portion 331b of the first heat dissipation member and the surface 383s of the heat dissipation member 383 of the third heat dissipation member 333 are disposed at the same air flow path S3b. In such a case, pressure loss is less likely to increase as compared with the case where the first portion 331a of the first dissipation member and the second portion 331b of the first heat dissipation member, the second heat dissipation member 332, and the third heat dissipation member 333 are arranged in a same air flow path in series.

The heat reception plate 351a and the heat reception plate 351b may include a heat dissipation member of an unevenness shape or the fin shape. According to such a configuration, heat is dissipated from the heat reception plates 351a and 351b in addition to the heat dissipation members 381a and 381b. In such a case, it is preferable that the heat reception plates 351a and 351b are arranged in air flow paths different from the air flow paths S3a and S3b.

Fourth Embodiment

The fourth embodiment will be described.
In the fourth embodiment, an image projection apparatus includes the light source device 100 according to the first embodiment, the light source device 200 according to the second embodiment, or the light source device 300 according to the third embodiment. For the fourth embodiment, the description of the same configurations as in the first embodiment to the third embodiment will be omitted, and those different from the first embodiment to the third embodiment will be described below.

Figure 16:
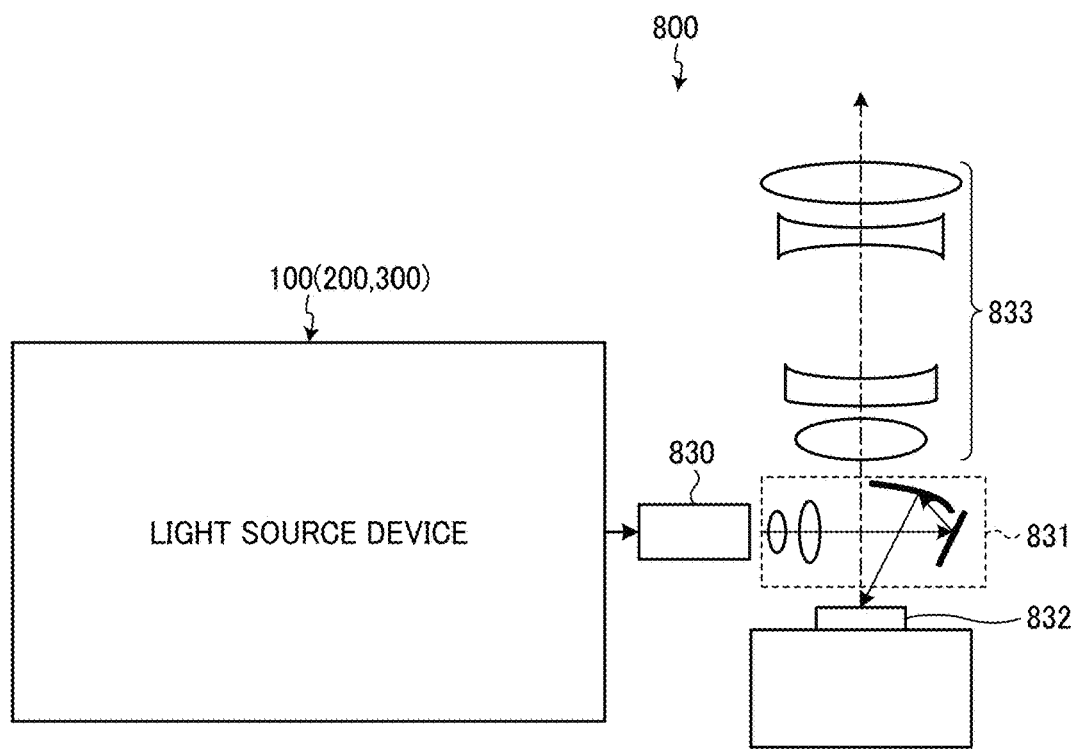
FIG. 16 is a diagram of a projector according to a fourth embodiment.

FIG. 16 is a diagram of a projector 800 according to a fourth embodiment.

The projector 800 as an image projection apparatus or a display apparatus includes the light source device 100 (200, 300), the light homogenizer 830, the image generation element 832 (image display element), and the projection optical system.

The light source device 100 (200, 300) emits light having wavelengths corresponding to colors of, for example, red, green, and blue (RGB).

The light homogenizer 830 homogenizes (mixes) the light beam emitted from the light source device 100 (200, 300). Specifically, the light beam incident from the entrance surface of the light homogenizer 830 propagates while repeating reflection in the light homogenizer 830, and exit from an exit surface of the light homogenizer 30. The light homogenizer 830 forms a light beam having a uniform intensity on the exit surface by reflecting the light beam incident from the entrance surface multiple times in the light homogenizer 830. Examples of the light homogenizer 830 include a light tunnel enclosed by four minor plates with their mirrors facing inside, which is a hollow tunnel; a rod integrator that is a prism of transparent material such as glass; and a fly-eye lens is used. For example, when a light tunnel is applied as the light homogenizer 830, the aspect ratio of the image generation element 832 (image display element) is substantially the same as that of the image generation element 832, and the shape of the exit of the light tunnel is projected onto the surface of the image generation element 832 so that the surface of the image generation element 832 is efficiently illuminated with illumination light without waste.

The illumination optical system 831 substantially uniformly illuminates the image generation element 832 with illumination light homogenized (i.e., the light having the intensity uniformized) by the light homogenizer 830. The illumination optical system 831 includes, for example, one or more of lenses and one or more of optical elements having one or more of reflection surfaces.

The image generation element 832 (image display element) is a light valve (spatial light modulator) such as a digital micromirror device (DMD), a transmissive liquid crystal panel, or a reflective liquid crystal panel. The illumination optical system 831 irradiates the image generation element 832 (image display element) with illumination light emitted from the light source device 100 (200, 300). The image generation element 832 modulates the illumination light to generate the image. The image generation element 832 (image display element) is an example of the image generation panel 165.

The projection optical system 833 (projection system 166) magnifies and projects the image formed by the image generation element 832 (image display element) onto a screen (projection surface). The projection optical system 833 includes, for example, at least one lens. Since the projection optical system 833 has a conjugate relation in which the image on the surface of the image generation element 832 (image display element) is imaged on a predetermined screen position (projected surface) as an enlarged image, the projection optical system 833 enlarges and projects an image spatially modulated on the surface of the image generation element 832 to display.

In some embodiments, a display apparatus includes: the light source device; a light homogenizer to homogenize the light beam emitted from the light source device and emit a homogenized light beam; an image generation element to generate an image by modulating the homogenized light beam emitted from the light homogenizer; and a projection optical system to magnify and project the image onto a projection surface.

Figure 17:
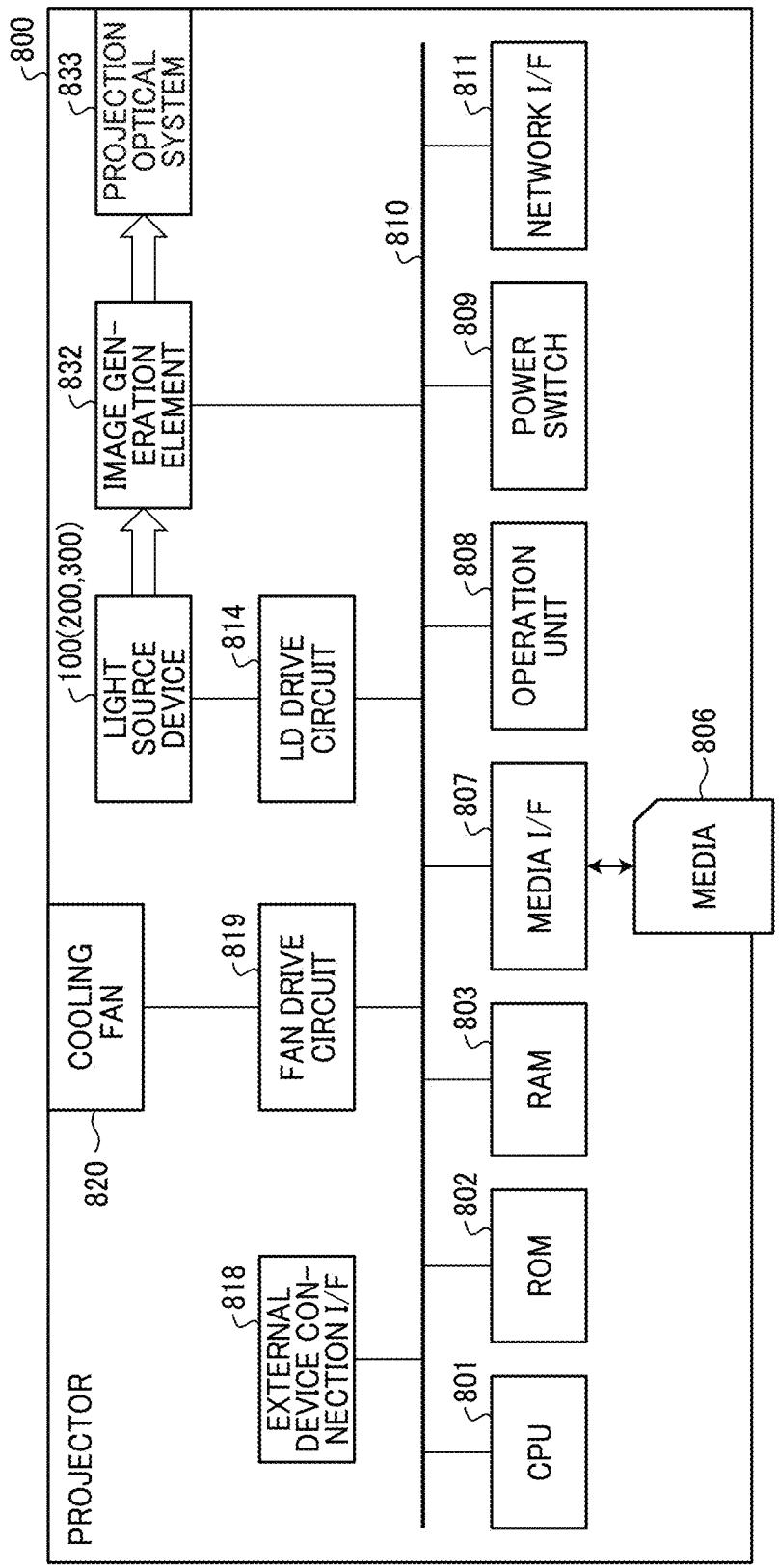
FIG. 17 is a block diagram of a hardware configuration of the projector.

FIG. 17 is a block diagram of a hardware configuration of the projector 800. As illustrated in FIG. 17, the projector 800 includes a central processing unit (CPU) 801, a read only memory (ROM) 802, a random access memory (RAM) 803, a media interface (I/F) 807, an operation unit 808, a power switch 809, a bus line 810, a network interface (I/F) 811, a laser diode (LD) drive circuit 814, the light source device 100 (200, 300s), an image generation element 832 as a spatial light modulation device, a projection optical system 833, an external device connection interface (I/F) 818, a fan drive circuit 819, and a cooling fan 820.

The CPU 801 controls the entire operation of the projector 800. The ROM 802 stores a program used to drive the CPU 801. The RAM 803 is used as a working area of the CPU 801.

The media I/F 807 controls the media 806 such as a flash memory to read or write (store).

The operation unit 808 is provided with various keys, buttons, or LEDs, and is used to perform various operations other than ON and OFF (ON/OFF) of the power supply of the projector 800 by the user. For example, the operation unit 808 receives instruction operations such as an adjustment of the size of the projection image, an adjustment of the color tone, a focus adjustment, and a keystone adjustment, and outputs the received operation to the CPU 801.

The power switch 809 is a switch to switch ON and OFF the power of the projector 800.

The bus line 810 is an address bus or a data bus for electrically connecting each member such as the CPU 801 in FIG. 17.

The network OF 811 is an interface to perform data communication using a communication network such as the Internet.

The LD drive circuit 814 controls the light source device 100 (200, 300) to turn on and off under the control of the CPU801.

When the light source device 100, the light source device 200, or the light source device 300 is turned on under the control of the LD drive circuit 814, the light source device 100, the light source device 200, or the light source device 300 emits an illumination light beam to the image generation element 832 (the image display element).

The image generation element 832 using a spatial light modulation method modulates the illumination light beam based on an image data given via the external device connection OF 818 and generates an image light beam. The image light beam is projected onto a screen by the projection optical system 833. As the image generation element 832 (image display element), for example, a liquid crystal panel or a digital micromirror device (DMD) is used. The LD drive circuit 814, the light source device 100 (200, 300), the image generation element 832, and the projection optical system 833 work as a projection unit (projection means) to project a projection image onto a projection surface based on image data.

A personal computer (PC) is directly connected to the external device connection OF 818 to acquire control signals and image data with the PC.

The fan drive circuit 819 is connected to the CPU 801 and the cooling fan 820, and drives or stops the cooling fan 820 based on a control signal from the CPU 801.

The cooling fan 820 exhausts the air inside the projector 800 to cool the inside of the projector 800 by rotating the fan.

When the electric power is supplied, the CPU 801 is activated according to a control program stored in the ROM 802 in advance, and provides a control signal to the LD drive circuit 814 to turn on the light source device 100 (200, 300) and also provides a control signal to the fan drive circuit 819 to rotate the cooling fan 820 at a predetermined speed. In the projector 800, when the electric power is supplied from the power supply circuit 21, the image generation element 832 (image display element) is on a standby state to display an image, and further, electric power supplied from the power supply circuit 21 is provided to other various members.

In the projector 800, when the power switch 809 is turned off, a power OFF signal is sent to the CPU 801 from the power switch 809. When the CPU 801 detects the power OFF signal, the CPU 801 provides a control signal to the LD drive circuit 814 to turn off the light source device 100 (200, 300). After passing a predetermined time, the CPU 801 provides a control signal to the fan drive circuit 819 to stop the cooling fan 820, finishes the CPU's control processing, and provides an instruction to the power supply circuit 21 to stop the power supply.

According to the present embodiment, since the light source device 100 (200, 300) is used, the projector 800 having a small size can be provided.

In the present embodiment described above, a preferable example is described, but the present embodiment is not limited thereto.

In particular, the specific shapes and numerical values of the respective members exemplified in the embodiments are merely examples for implementing the disclosure. The technical scope of the disclosure should not be limitedly interpreted thereby.

As described above, the present invention is not limited to the contents described in each of the above-described embodiments, and can be appropriately modified without departing from the gist thereof.

Aspects of the present invention is as follows, for example.

In a first aspect, a light source device includes a container including four or more of heat generators inside the container and is accommodated in an exterior. A first surface of the container includes two or more of the heat generators, a second surface of the container substantially perpendicular to the first surface of the container includes one or more of the heat generators, and a third surface of the container substantially perpendicular to the first surface of the container and opposed to the second surface of the container includes one or more of the heat generators. The first surface of the container is thermally connected to the one or more of a first dissipation members, the second surface of the container is thermally connected to one or more of the second heat dissipation member, and the third surface of the container is thermally connected to one or more of a third heat dissipation member. The first heat dissipation member, the second heat dissipation member, and the third heat dissipation member has a surface opposed to a first surface of the exterior and takes and exhaust air from the first surface of the exterior.

In a second aspect, in the light source device according the first aspect, at least one of the first heat dissipation member, the second heat dissipation member, or the third heat dissipation member includes multiple unevenness.

In a third aspect, in the light source device according to the third second aspect, at least one of the first heat dissipation member, the second heat dissipation member, or the third heat dissipation member includes a heat dissipation fin in which multiple heat dissipation plates are arranged.

In a fourth aspect, in the light source device according to the third aspect, the multiple heat dissipation plates are formed so that the multiple heat dissipation plates are not parallel to the first surface of the container.

In a fifth aspect, in the light source device according to the fourth aspect, the heat dissipation plates of the second heat dissipation member and the third heat dissipation member are substantially perpendicular to the heat dissipation plate of the first heat dissipation plate, a second surface of the exterior opposed to the second surface of the container has a port to take and exhaust air, and a third surface of the exterior opposed to the third surface of the container has a port to take and exhaust air.

In a sixth aspect, in the light source device according to any one of the first aspect to the fifth aspect, the first dissipation member includes a heat dissipation plate substantially parallel to the second surface of the container, the fourth surface of the container substantially perpendicular to the first surface of the container, the second surface of the container, and the third surface of the container has a port to take and exhaust air, the second heat dissipation member and the third heat dissipation member include heat dissipation plates substantially parallel to the fourth surface of the container.

In a seventh aspect, in the light source device according to any one of the first aspect to the sixth aspect, the first heat dissipation member includes multiple heat dissipation members, at least two or more of the heat generators are thermally connected to the first heat dissipation members different from each other, at least any one of the heat generators is thermally connected to two or more of the first heat dissipation members.

In an eighth aspect, in the light source device according to any one of the first aspect to the seventh aspect, one or more of the heat generators among two or more of the heat generators arranged on the first surface of the container is a light-emission-and-heat-generation member, and one or more of remaining heat generators is a light-reception-and-heat generator (i.e., heat is generated by light reception).

In a ninth aspect, in the light source device according to any one of the first aspect to the eighth aspect, one or more of the heat generators among the heat generators arranged on the second surface of the container generate heat by light emission, and one or more of the light generation member among the light generation members arranged on the third surface of the container generates heat by light reception.

In a tenth aspect, in the light source device according to any one of the first aspect to the ninth aspect, at least one of the first heat dissipation member, the second heat dissipation member, or the third heat dissipation member are thermally connected to any one of the heat generators via a heat transportation member to conduct heat from the heat reception member.

In an eleventh aspect, in the light source device according to the tenth aspect, the light reception member includes a heat dissipation member having an unevenness shape or a fin shape, and the heat transportation member is a heat pipe.

In a twelfth aspect, in the light source device according to the eleventh aspect, the second heat dissipation member includes a heat reception plate to receive heat from the heat generator. The heat reception plate has a protrusion portion protruded from the second surface of the container as viewed from the perpendicular direction to the second surface of the container, and the protrusion portion is adjacent to the first heat dissipation member.

In a thirteenth aspect, in the light source device according to any one of the first aspect to the twelfth aspect, the first aspect of the exterior opposed to the first surface of the container has a port to take and exhaust air.

In a fourteenth aspect, in the light source device according to the first aspect to the thirteenth aspect, a port to take and exhaust air is located at a position, which is adjacent to at least a portion of the first heat dissipation, on a fourth surface of the exterior substantially perpendicular to the first surface of the exterior, the second surface of the exterior opposed to the second surface of the container, and first surface of the exterior and the second surface of the exterior, In a fifteenth aspect, in the light source device according to the fourteenth aspect, one or more of an air flow generator is installed between the first surface of the exterior and the first dissipation member.

In a sixteenth aspect, in the light source device according to the fifteenth aspect, the exterior includes a fifth surface of opposed to the fourth surface of the exterior, and an expression below is satisfied.

$$L1 \leq L2$$

where L1 is a distance between an end surface of the one or more of air flow generators facing the fifth surface of the exterior and the fifth surface of the exterior, and L2 is a distance between an end surface of the heat dissipation member facing the fifth surface of the exterior and the fifth surface of the exterior.

In a seventeenth aspect, in the light source device according to the sixteenth aspect, an expression below is satisfied.

$$LA \geq LC \text{ and } LA \geq LD, \text{ and}$$

$$LB \geq LC \text{ and } LB \geq LD,$$

where LA is a distance between the second surface of the container and the second surface of the exterior, LB is a distance between the third surface of the container and the third surface of the exterior, LC is a distance between the fourth surface of the container and the fourth surface of the exterior, and LD is a distance between the fifth surface of the container and the fifth surface of the exterior.

In an eighteenth aspect, in the light source device according to any one of the first aspect to the seventeenth aspect, an auxiliary heat dissipation member is arranged one or more of surfaces the container other than the first surface of the container, the second surface of the container, and the third surface of the container. In the first surface, the second surface, and the third surface of the container, the heat dissipation member is arranged.

In a nineteenth aspect, a display apparatus includes: the light source device according to any one of the first aspect to the eighteenth aspect; a light homogenizer to homogenize a light beam incident from the light source device; an image display element to modulate the light beam from the light homogenizer and generate an image; and projection optical system to enlarge and project the image onto a projection surface.

In a twentieth aspect, a light source device includes: four or more of heat generators; a container accommodating the four or more of heat generators, the container having: a first container surface; a second container surface perpendicular to the first container surface; and a third container surface perpendicular to the first container surface and opposed to the second container surface; multiple heat dissipation members outside the container, the multiple heat dissipation members to cool to the four or more of the heat generators; and an exterior case accommodating the container and the multiple heat dissipation members. The four or more of heat generators include: a first heat generator on the first container surface; a second heat generator on the first container surface; a third heat generator on the second container surface; a fourth heat generator on the third container surface. The multiple heat dissipation members include: a first heat dissipation member thermally connected to the first container surface; a second heat dissipation member thermally connected to the second container surface; and a third heat dissipation member thermally connected to the third container surface. The exterior case includes a first exterior surface opposed to the first heat dissipation member, the second heat dissipation member, and the third heat dissipation member. The first exterior surface of the exterior case exhausts air from the first heat dissipation member, the second heat dissipation member, and the third heat dissipation member.

In a twenty-first aspect, in the light source device according to the twentieth aspect, at least one of the first heat dissipation member, the second heat dissipation member, or the third heat dissipation member includes multiple uneven portions.

In a twenty-second aspect, in the light source device according to the twenty-first aspect, the multiple uneven portions include a heat dissipation fin including multiple heat dissipation plates.

In a twenty-third aspect, in the light source device according to the twenty-second aspect, the multiple heat dissipation plates are inclined to the first container surface.

In a twenty-fourth aspect, in the light source device according to the twenty-third aspect, the first heat dissipation member includes the multiple heat dissipation plates including first heat dissipation plates, the second heat dissipation member includes the multiple heat dissipation plates including second heat dissipation plates, and the third heat dissipation member includes the multiple heat dissipation plates including third heat dissipation plates. The second heat dissipation plates and the third heat dissipation plates are perpendicular to the first heat dissipation plates. The exterior case includes: a second exterior surface opposed to the second container surface and having an intake and an exhaust port, a third exterior surface opposed to the third container surface and having another intake and another exhaust port.

In a twenty-fifth aspect, in the light source device according to any one of the twenties aspect to the twenty-fourth aspect, the first heat dissipation member includes a first heat dissipation plate parallel to the second container surface, the container includes a fourth container surface perpendicular to the first container surface, the second container surface, and the third container surface, the fourth container surface has an intake and exhaust port, the second heat dissipation member includes a second heat dissipation plate, the third heat dissipation member includes a third heat dissipation plate, the second heat dissipation plate and the third heat dissipation plate are parallel to the fourth container surface.

In a twenty-sixth aspect, in the light source device according to any one of the twenties aspect to the twenty-fifth aspect, the multiple heat dissipation members include first multiple heat dissipation members, the first heat generator is thermally connected to one or more of the first multiple heat dissipation members, the second heat generator is thermally connected to other of the first multiple heat dissipation members different from the first multiple heat dissipation members thermally connected to the first heat generator.

In a twenty-seventh aspect, in the light source device according to any one of the twentieth aspect to the twenty-sixth aspect, the first heat generator emits light to generate heat, and the second heat generator receives light to generate heat.

In a twenty-eighth aspect, in the light source device according to any one of the twenties aspect to the twenty-seventh aspect, the third heat generator emits light to generate heat, and the fourth heat generator receives light to generate heat.

In a twenty-ninth aspect, the light source device according to any one of the twentieth aspect to the twenty-eighth aspect, further includes: a heat reception member to receive heat from at least one of the four or more of heat generators; and a heat transportation member to transport heat from the heat reception member to at least one of the multiple heat dissipation members. At least one of the first heat dissipation member, the second heat dissipation member, or the third heat dissipation member is thermally connected to any one of the four or more of heat generators via the heat reception member or the heat transportation member.

In a thirteenth aspect, in the light source device according to the twenty-ninth aspect, the heat reception member has an uneven shape or a fin shape, and the heat transportation member includes a heat pipe.

In a thirty-first aspect, in the light source device according to the thirtieth aspect, the second heat dissipation member includes a heat reception plate receives heat from the second heat generator, the heat reception plate includes a protrusion portion protruded from the second container surface in a direction perpendicular to the second container surface, and the protrusion portion is adjacent to the first heat dissipation member.

In a thirty-second aspect, in the light source device according to any one of the twentieth aspect to the thirtieth aspect, the first exterior surface opposed to the first container surface has an intake and exhaust port.

In a thirty-third aspect, in the light source device according to any one of the twentieth aspect to the thirty-aspect, the container includes: a fourth container surface perpendicular to the first container surface, the second container surface, and the third container surface; and a fifth container surface opposed to the fourth container surface. The exterior case further includes: a second exterior surface opposed to the second container surface; and a fourth exterior surface perpendicular to the first exterior surface and the second exterior surface, and the third exterior surface, the fourth exterior surface opposed to the fourth container surface. The fourth exterior surface has an intake and exhaust port in a position adjacent to at least a portion of the first heat dissipation member.

In a thirty-third aspect, in the light source device according to any one of the twentieth aspect to the thirty-aspect, further includes one or more of air flow generators between the first exterior surface and the first heat dissipation member.

In a thirty-fifth aspect, in the light source device according to thirty-fourth aspect, the exterior case includes a fifth exterior surface opposed to the fourth exterior surface, and an expression below is satisfied:

L1≤L2, where
L1 is a distance between an end surface of the one or more of air flow generators facing the fifth exterior surface and the fifth exterior surface, and
L2 is a distance between an end surface of the first heat dissipation member facing the fifth exterior surface and the fifth exterior surface.

In a thirty-sixth aspect, in the light source device according to the thirty-fifth aspect, an expressions below are satisfied:

LA≥LC and LA≥LD, and

LB≥LC and LB≥LD, where
LA is a distance between the second container surface and the second exterior surface,
LB is a distance between the third container surface and the third exterior surface,
LC is a distance between the fourth container surface and the fourth exterior surface, and
LD is a distance between the fifth container surface and the fifth exterior surface.

In a thirty-seventh aspect, in the light source device according to any one of the twentieth aspect to the thirty-sixth aspect, the container has one or more of container surfaces other than the first container surface, the second container surface, and the third container surface, the multiple heat dissipation members include one or more of auxiliary heat dissipation members.

In a thirty-eighty aspect, a display apparatus includes: the light source device according to any one of the twentieth aspect to the thirty-seventh aspect to emit a light beam; a light homogenizer to homogenize the light beam emitted from the light source device and emit a homogenized light beam; an image generation element to generate an image by modulating the homogenized light beam emitted from the light homogenizer; and a projection optical system to magnify and project the image onto a projection surface.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention. Each of the functions of the described embodiments may be implemented by one or more processing circuits or circuitry. Processing circuitry includes a programmed processor, as a processor includes circuitry. A processing circuit also includes devices such as an application specific integrated circuit (ASIC), a digital signal processor (DSP), a field programmable gate array (FPGA), and conventional circuit components arranged to perform the recited functions.

The invention claimed is:
1. A light source device comprising:
four or more heat generators;
a container accommodating the four or more heat generators, the container having:
  a first container surface;
  a second container surface perpendicular to the first container surface; and
  a third container surface perpendicular to the first container surface and opposed to the second container surface;
multiple heat dissipation members outside the container, the multiple heat dissipation members configured to cool the four or more heat generators; and
an exterior case accommodating the container and the multiple heat dissipation members,
wherein the four or more heat generators include:
  a first heat generator on the first container surface;
  a second heat generator on the first container surface;
  a third heat generator on the second container surface;
  a fourth heat generator on the third container surface, and
the multiple heat dissipation members include:

a first heat dissipation member thermally connected to the first container surface;

a second heat dissipation member thermally connected to the second container surface; and a third heat dissipation member thermally connected to the third container surface, the exterior case includes a first exterior surface opposed to the first heat dissipation member, the second heat dissipation member, and the third heat dissipation member, and the first exterior surface of the exterior case exhausts air from the first heat dissipation member, the second heat dissipation member, and the third heat dissipation member.

2. The light source device according to claim 1, wherein at least one of the first heat dissipation member, the second heat dissipation member, or the third heat dissipation member includes multiple uneven portions.

3. The light source device according to claim 2, wherein the multiple uneven portions include a heat dissipation fin including multiple heat dissipation plates.

4. The light source device according to claim 3, wherein the multiple heat dissipation plates are inclined to the first container surface.

5. The light source device according to claim 4, wherein the first heat dissipation member includes the multiple heat dissipation plates including first heat dissipation plates, the second heat dissipation member includes the multiple heat dissipation plates including second heat dissipation plates, the third heat dissipation member includes the multiple heat dissipation plates including third heat dissipation plates, the second heat dissipation plates and the third heat dissipation plates are perpendicular to the first heat dissipation plates, and the exterior case includes:
a second exterior surface opposed to the second container surface and having an intake and an exhaust port,
a third exterior surface opposed to the third container surface and having another intake and another exhaust port.

6. The light source device according to claim 1, wherein the first heat dissipation member includes a first heat dissipation plate parallel to the second container surface, the container includes a fourth container surface perpendicular to the first container surface, the second container surface, and the third container surface, the fourth container surface has an intake and exhaust port, the second heat dissipation member includes a second heat dissipation plate, the third heat dissipation member includes a third heat dissipation plate, the second heat dissipation plate and the third heat dissipation plate are parallel to the fourth container surface.

7. The light source device according to claim 1, wherein the multiple heat dissipation members include first multiple heat dissipation members, the first heat generator is thermally connected to one or more of the first multiple heat dissipation members, the second heat generator is thermally connected to other of the first multiple heat dissipation members different from the first multiple heat dissipation members thermally connected to the first heat generator.

8. The light source device according to claim 1, wherein the first heat generator is configured to emit light to generate heat, and the second heat generator is configured to receive light to generate heat.

9. The light source device according to claim 1, wherein the third heat generator is configured to emit light to generate heat, and the fourth heat generator is configured to receive light to generate heat.

10. The light source device according to claim 1, further comprising:

a heat reception member configured to receive heat from at least one of the four or more heat generators; and a heat transportation member configured to transport heat from the heat reception member to at least one of the multiple heat dissipation members, wherein at least one of the first heat dissipation member, the second heat dissipation member, or the third heat dissipation member is thermally connected to any one of the four or more heat generators via the heat reception member or the heat transportation member.

11. The light source device according to claim 10, wherein the heat reception member has an uneven shape or a fin shape, and the heat transportation member includes a heat pipe.

12. The light source device according to claim 11, wherein the second heat dissipation member includes a heat reception plate configured to receive heat from the second heat generator, the heat reception plate includes a protrusion portion protruded from the second container surface in a direction perpendicular to the second container surface, and the protrusion portion is adjacent to the first heat dissipation member.

13. The light source device according to claim 1, wherein the first exterior surface is opposed to the first container surface and has an intake and exhaust port.

14. The light source device according to claim 1, wherein the container includes:

a fourth container surface perpendicular to the first container surface, the second container surface, and the third container surface; and a fifth container surface opposed to the fourth container surface, the exterior case further includes:
a second exterior surface opposed to the second container surface;
a third exterior surface opposed to the third container surface; and
a fourth exterior surface perpendicular to the first exterior surface, the second exterior surface, and the third exterior surface, the fourth exterior surface opposed to the fourth container surface, wherein the fourth exterior surface has an intake and exhaust port in a position adjacent to at least a portion of the first heat dissipation member.

15. The light source device according to claim 14, further comprising one or more air flow generators between the first exterior surface and the first heat dissipation member.

16. The light source device according to claim 15, wherein the exterior case includes a fifth exterior surface opposed to the fourth exterior surface, wherein an expression below is satisfied:

$L1 \leq L2$, where
L1 is a distance between an end surface of the one or more air flow generators facing the fifth exterior surface and the fifth exterior surface, and
L2 is a distance between an end surface of the first heat dissipation member facing the fifth exterior surface and the fifth exterior surface.

17. The light source device according to claim 16, wherein expressions below are satisfied:

$LA \geq LC$ and $LA \geq LD$, and $LB \geq LC$ and $LB \geq LD$, and where
LA is a distance between the second container surface and the second exterior surface,
LB is a distance between the third container surface and the third exterior surface,
LC is a distance between the fourth container surface and the fourth exterior surface, and
LD is a distance between the fifth container surface and the fifth exterior surface.

18. The light source device according to claim 1,
wherein the container has one or more container surfaces other than the first container surface,
the second container surface, and the third container surface,
the multiple heat dissipation members include one or more auxiliary heat dissipation members.

19. A display apparatus comprising:
the light source device according to claim 1 and configured to emit a light beam;
a light homogenizer configured to homogenize the light beam emitted from the light source device and emit a homogenized light beam;
an image generation element configured to generate an image by modulating the homogenized light beam emitted from the light homogenizer; and
a projection optical system configured to magnify and project the image onto a projection surface.

* * * * *